United States Patent
Kishioka et al.

(10) Patent No.: US 7,790,356 B2
(45) Date of Patent: *Sep. 7, 2010

(54) CONDENSATION TYPE POLYMER-CONTAINING ANTI-REFLECTIVE COATING FOR SEMICONDUCTOR

(75) Inventors: Takahiro Kishioka, Toyama (JP); Rikimaru Sakamoto, Toyama (JP); Yoshiomi Hiroi, Toyama (JP); Daisuke Maruyama, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 644 days.

This patent is subject to a terminal disclaimer.

(21) Appl. No.: 11/547,001

(22) PCT Filed: Apr. 6, 2005

(86) PCT No.: PCT/JP2005/006785

§ 371 (c)(1),
(2), (4) Date: Oct. 2, 2006

(87) PCT Pub. No.: WO2005/098542

PCT Pub. Date: Oct. 20, 2005

(65) Prior Publication Data

US 2008/0038678 A1    Feb. 14, 2008

(30) Foreign Application Priority Data

Apr. 9, 2004    (JP) .............................. 2004-115385

(51) Int. Cl.
*G03F 7/11*    (2006.01)
*C08L 79/04*    (2006.01)
*C09D 163/00*    (2006.01)
*C09D 179/04*    (2006.01)
*H01L 21/027*    (2006.01)

(52) U.S. Cl. .................. 430/311; 430/271.1; 430/330; 430/325; 528/363; 528/367; 438/952

(58) Field of Classification Search ........................ None
See application file for complete search history.

(56) References Cited

U.S. PATENT DOCUMENTS

| | | | | |
|---|---|---|---|---|
| 3,847,769 A | * | 11/1974 | Garratt et al. ................ | 522/100 |
| 4,316,952 A | * | 2/1982 | Wendling .................. | 430/285.1 |
| 4,465,722 A | * | 8/1984 | Fiaux et al. .................... | 528/88 |
| 5,693,691 A | | 12/1997 | Flaim et al. | |
| 5,919,599 A | | 7/1999 | Meador et al. | |
| 6,284,428 B1 | | 9/2001 | Hirosaki et al. | |
| 7,226,721 B2 | * | 6/2007 | Takei et al. ............... | 430/271.1 |
| 7,595,144 B2 | * | 9/2009 | Kishioka et al. ............ | 430/311 |
| 2002/0055064 A1 | | 5/2002 | Iguchi et al. | |
| 2004/0110096 A1 | | 6/2004 | Kishioka et al. | |
| 2008/0268379 A1 | * | 10/2008 | Sakamoto .................. | 430/322 |

FOREIGN PATENT DOCUMENTS

| | | |
|---|---|---|
| EP | 1 298 492 A2 | 4/2003 |
| EP | 1 298 493 A2 | 4/2003 |
| EP | 1 378 796 A | 1/2004 |
| EP | 1 560 070 A1 | 8/2005 |
| JP | 50-704099 A * | 6/1975 |
| JP | A 10-204110 | 8/1998 |
| JP | A 11-279523 | 10/1999 |
| JP | A 2000-221690 | 8/2000 |
| JP | A 2002-148791 | 5/2002 |
| WO | WO 02/086624 | 10/2002 |
| WO | WO 02/086624 A1 | 10/2002 |
| WO | WO 2004/034148 A1 | 4/2004 |

OTHER PUBLICATIONS

Grant et al (eds), Chemical Dictionary, FIfth Edition, McGraw-Hill Book Compay, New York, N.Y. 1987, p. 368.*
Derwent-Acc-No: 1975-64735W, English abstract of JP 50070499 A published Jun. 11, 1975, two pages.*
AN 1975:532605 CAPLUS. English abstract of JP 50070499 a, entered STN 12 May 7, 1984, ACS on STN, two pages from file CAPLUS.*
Schmaljohann et al., "Design Strategies for 157 nm Single-Layer Photoresists: Lithographic Evaluation of a Poly($\alpha$-Trifluoromethyl Vinyl Alcohol) Copolymer," Proceedings of SPIE, vol. 3999, pp. 330-334, (2000).
Crawford et al., "New Materials for 157 nm Photoresists: Characterization and Properties," Proceedings of SPIE, vol. 3999, pp. 357-364, (2000).
Patterson et al., "Polymers for 157 nm Photoresist Applications: A Progress Report," Proceedings of SPIE, vol. 3999, pp. 365-374, (2000).

* cited by examiner

*Primary Examiner*—Cynthia Hamilton
(74) *Attorney, Agent, or Firm*—Oliff & Berridge, PLC

(57) ABSTRACT

There is provided an anti-reflective coating forming composition comprising a polymer having a pyrimidinetrione structure, imidazolidinedione structure, imidazolidinetrione structure or triazinetrione structure and a solvent. The anti-reflective coating obtained from the composition has a high preventive effect for reflected light, causes no intermixing with photoresists, and can use in lithography process by use of a light having a short wavelength such as ArF excimer laser beam (wavelength 193 nm) or F2 excimer laser beam (wavelength 157 nm), etc.

16 Claims, No Drawings

CONDENSATION TYPE POLYMER-CONTAINING ANTI-REFLECTIVE COATING FOR SEMICONDUCTOR

TECHNICAL FIELD

The present invention relates to a composition for forming an anti-reflective coating. Specifically, the present invention relates to an anti-reflective coating for reducing reflection of irradiation light for exposing a photoresist layer applied on a semiconductor substrate from the substrate in lithography process for manufacturing a semiconductor device, and a composition for forming the anti-reflective coating. More specifically, the present invention relates to an anti-reflective coating that is used in lithography process for manufacturing a semiconductor device in which an irradiation light for exposure of wavelength 248 nm and 193 nm, etc. is utilized, and a composition for forming the anti-reflective coating. Further, the present invention relates to a method for forming photoresist pattern by use of the anti-reflective coating.

BACKGROUND ART

Conventionally, in the manufacture of semiconductor devices, micro-processing by lithography using a photoresist composition has been carried out. The micro-processing is a processing method comprising forming a thin film of a photoresist composition on a silicon wafer, irradiating actinic rays such as ultraviolet rays through a mask pattern on which a pattern for a semiconductor device is depicted, developing it to obtain a photoresist pattern, and etching the substrate using the photoresist pattern as a protective film. However, in recent progress in high integration of semiconductor devices, there has been a tendency that shorter wavelength actinic rays are being used, i.e., ArF excimer laser beam (wavelength 193 nm) has been taking the place of i-line (wavelength 365 nm) or KrF excimer laser beam (wavelength 248 nm). Along with this change, influences of random reflection and standing wave of actinic rays from a substrate have become serious problems. Accordingly, it has been widely studied to provide an anti-reflective coating between the photoresist and the substrate (bottom anti-reflective coating).

As the anti-reflective coatings, inorganic anti-reflective coatings made of titanium, titanium dioxide, titanium nitride, chromium oxide, carbon or α-silicon, etc. and organic anti-reflective coatings made of a light absorbing substance and a high molecular weight compound are known. The former requires an installation such as a vacuum deposition apparatus, a CVD apparatus or a sputtering apparatus, etc. In contrast, the latter is considered advantageous in that it requires no special installation so that many studies have been made. For example, mention may be made of the acrylic resin type anti-reflective coating having a hydroxyl group being a crosslink-forming substituent and a light absorbing group in the same molecule as disclosed in U.S. Pat. No. 5,919,599 and the novolak resin type anti-reflective coating having a hydroxyl group being a crosslink-forming substituent and a light absorbing group in the same molecule as disclosed in U.S. Pat. No. 5,693,691.

The physical properties desired for organic anti-reflective coating include high absorbance to light and radioactive rays, no intermixing with the photoresist layer (being insoluble in photoresist solvents), no diffusion of low molecular substances from the anti-reflective coating material into the top-coat photoresist upon application or baking under heating, and a higher dry etching rate than the photoresist.

In recent years, miniaturization of process size in a lithography process by use of KrF excimer laser beam or ArF excimer laser beam, that is, miniaturization of formed photoresist pattern size is advanced. In order to prevent collapse or the like of photoresist pattern that is accompanied with miniaturization of photoresist pattern, it is desired to make the photoresist thinner. In addition, when the photoresist is used in a form of thin film, in order to inhibit decrease in film thickness of photoresist layer in the process of removing organic anti-reflective coating used together by etching, it is desired that the organic anti-reflective coating can be removed by etching for a shorter time. That is, in order to make the time required for an etching removing step shorter, there are demands for organic anti-reflective coatings that can be used in a form of thinner film compared with the conventional ones, or organic anti-reflective coatings having a higher selection ratio of etching rate between the organic anti-reflective coating and photoresist.

On the other hand, it is known a technique in which tris (hydroxyalkyl) isocyanurate is used as a broad UV absorber (see, for example Patent Document 1), and a curable composition containing cyanuric acid as a polymerizable organic compound is known (see, for example Patent Document 2). An anti-reflective coating composition containing a cyanuric acid derivative is also known (see, for example Patent Document 3). In addition, it is disclosed to use a polyester synthesized from 1,3,5-tris(2-hydroxyethyl)cyanuric acid for an antireflective coating (see, for example Patent Documents 4 and 5).

Patent Document 1: JP-A-11-279523 (1999)

Patent Document 2: JP-A-10-204110 (1998)

Patent Document 3: WO 02/086624 pamphlet

Patent Document 4: EP-A-1298492 (2003)

Patent Document 5: EP-A-1298493 (2003)

DISCLOSURE OF INVENTION

Problem to be Solved by the Invention

An object of the present invention is to provide an anti-reflective coating having a strong absorption to a light having a short wavelength, particularly ArF excimer laser beam (wavelength 193 nm), and an anti-reflective coating forming composition for forming the anti-reflective coating. Another object of the present invention is to provide an anti-reflective coating that effectively absorbs light reflected from a semiconductor substrate in the use of ArF excimer laser beam (wavelength 193 nm) for fine processing in lithography process, and that causes no intermixing with a photoresist layer, and to provide an anti-reflective coating forming composition for forming the anti-reflective coating. Further, an object of the present invention is also to provide a method for forming a photoresist pattern by use of the anti-reflective coating forming composition.

Means for Solving the Problem

Taking the above-mentioned present status into account, the present inventors eagerly investigated, and as a result of it, they found that an anti-reflective coating excellent for lithography process by use of a light having a short wavelength can be formed from an anti-reflective coating forming composition containing a polymer having a pyrimidinetrione structure, imidazolidinedione structure, imidazolidinetrione structure or triazinetrione structure, and they completed the present invention.

That is, the present invention relates to the following aspects:

as a first aspect, an anti-reflective coating forming composition comprising a polymer having a structure of formula (1):

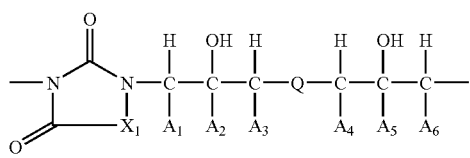
(1)

wherein $A_1$, $A_2$, $A_3$, $A_4$, $A_5$ and $A_6$ independently of one another are hydrogen atom, methyl or ethyl, $X_1$ is a group of formula (2), (3), (4) or (5):

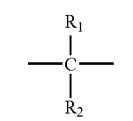
(2)

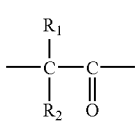
(3)

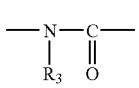
(4)

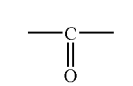
(5)

wherein $R_1$ and $R_2$ independently of each other are hydrogen atom, $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, or $R_1$ and $R_2$ together may form $C_{3-6}$ring, $R_3$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, Q is a group of formula (6) or (7):

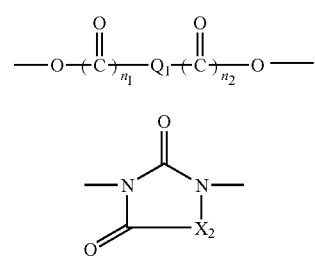
(6)

(7)

wherein $Q_1$ is $C_{1-10}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio, $n_1$ and $n_2$ independently of each other are a number of 0 or 1, $X_2$ is a group of formula (2), (3) or (5), and a solvent;

as a second aspect, the anti-reflective coating forming composition comprising as described in the first aspect, wherein the polymer having the structure of formula (1) is a polymer produced by a reaction of a compound of formula (8) with a compound of formula (9)

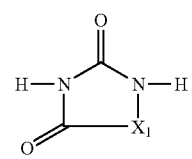
(8)

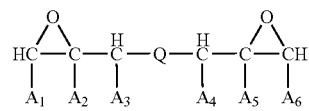
(9)

wherein $A_1$, $A_2$, $A_3$, $A_4$, $A_5$, $A_6$, $X_1$ and Q are as defined in the first aspect;

as a third aspect, the anti-reflective coating forming composition as described in the first aspect, wherein the polymer having the structure of formula (1) is a polymer produced by a reaction of a compound of formula (10) with a compound of formula (11)

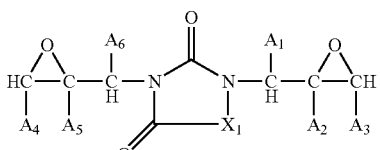
(10)

H—Q—H (11)

wherein $A_1$, $A_2$, $A_3$, $A_4$, $A_5$, $A_6$, $X_1$ and Q are as defined in the first aspect;

as a fourth aspect, the anti-reflective coating forming composition as described in the first aspect, wherein the structure of formula (1) is a structure of formula (12):

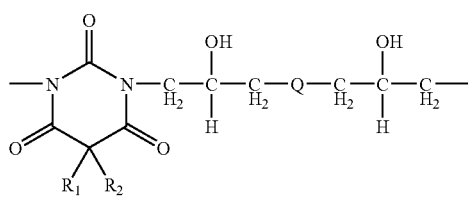
(12)

wherein $R_1$, $R_2$ and Q are as defined in the first aspect;

as a fifth aspect, the anti-reflective coating forming composition as described in the first aspect, wherein the structure of formula (1) is a structure of formula (13):

(13)

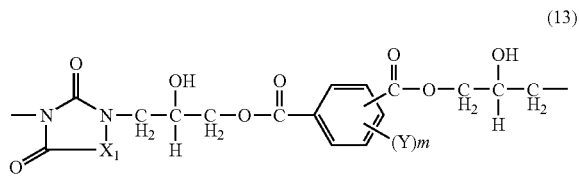

wherein $X_1$ is as defined in the first aspect, Y is $C_{1-6}$alkyl, halogen atom, $C_{1-6}$alkoxy, nitro, cyano, hydroxy or $C_{1-6}$alkylthio, m is an integer of 0 to 4, and in case where m is 2 to 4, the Ys may be identical with or different from each other;

as a sixth aspect, the anti-reflective coating forming composition as described in the first aspect, wherein the polymer having the structure of formula (1) is a polymer produced by a reaction of a compound of formula (8) with a compound of formula (9), and essentially having only the structure of formula (1) as a repeating structural unit;

as a seventh aspect, the anti-reflective coating forming composition as described in the first aspect, wherein the polymer having the structure of formula (1) is a polymer produced by a reaction of a compound of formula (10) with a compound of formula (11), and essentially having only the structure of formula (1) as a repeating structural unit;

as an eighth aspect, the anti-reflective coating forming composition as described in the second or sixth aspect, wherein the compound of formula (8) is an isocyanuric acid compound or a barbituric acid compound;

as a ninth aspect, the anti-reflective coating forming composition as described in the second or sixth aspect, wherein the compound of formula (9) is a phthalic acid diglycidyl ester compound, a terephthalic acid diglycidyl ester compound or an isophthalic acid diglycidyl ester compound;

as a tenth aspect, the anti-reflective coating forming composition as described in the third or seventh aspect, wherein the compound of formula (10) is a diglycidyl isocyanuric acid compound or a diglycidyl barbituric acid compound;

as an eleventh aspect, the anti-reflective coating forming composition as described in the third or seventh aspect, wherein the compound of formula (11) is a barbituric acid compound, a phthalic acid compound, a terephthalic acid compound or an isophthalic acid compound;

as a twelfth aspect, the anti-reflective coating forming composition as described in the first aspect, further comprising a crosslinking compound;

as a thirteenth aspect, the anti-reflective coating forming composition as described in the first aspect, further comprising an acid compound;

as a fourteenth aspect, the anti-reflective coating forming composition as described in the twelfth aspect, wherein the crosslinking compound is a nitrogen-containing compound having two to four nitrogen atoms substituted by methylol or alkoxymethyl;

as a fifteenth aspect, the anti-reflective coating forming composition as described in the thirteenth aspect, wherein the acid compound is a sulfonic acid compound, a iodonium salt based acid generator or a sulfonium salt based acid generator;

as a sixteenth aspect, the anti-reflective coating forming composition as described in the thirteenth aspect, wherein the acid compound is a combination of a iodonium salt based acid generator or a sulfonium salt based acid generator with a sulfonic acid compound;

as a seventeenth aspect, an anti-reflective coating obtained by coating the anti-reflective coating forming composition as described in any one of the first to sixteenth aspects on a semiconductor substrate, and baking it;

as an eighteenth aspect, a method for forming photoresist pattern for use in manufacture of semiconductor device, comprising the steps of:

coating the anti-reflective coating forming composition as described in any one of the first to sixteenth aspects on a semiconductor substrate, and baking it to form an anti-reflective coating, forming a photoresist layer on the anti-reflective coating, exposing the semiconductor substrate covered with the anti-reflective coating and the photoresist layer to light, and developing the photoresist layer after the exposure to light; and as a nineteenth aspect, the method for forming photoresist pattern as described in the eighteenth aspect, wherein the exposure to light is carried out with ArF excimer laser beam (wavelength 193 nm).

Effect of the Invention

The present invention relates to a composition for forming an anti-reflective coating having a strong absorption to a light having a short wavelength, particularly ArF excimer laser beam (wavelength 193 nm). The resulting anti-reflective coating effectively absorbs a light reflected from a semiconductor substrate. The present invention can provide an anti-reflective coating that effectively absorbs a light reflected from a semiconductor substrate in fine processing by use of ArF excimer laser beam (wavelength 193 nm) or the like, and that causes no intermixing with a photoresist layer. The present invention can provide an anti-reflective coating having a high dry etching rate compared with photoresists. Further, the use of the anti-reflective coating of the present invention makes possible to form a photoresist pattern having a good form in lithography process by use of ArF excimer laser beam (wavelength 193 nm) or the like.

BEST MODE FOR CARRYING OUT THE INVENTION

The anti-reflective coating forming composition of the present invention comprises a polymer having a structure of formula (1) and a solvent. In addition, the anti-reflective coating forming composition of the present invention comprises a polymer having a structure of formula (1), a crosslinking compound and a solvent. Further, the anti-reflective coating forming composition of the present invention comprises a polymer having a structure of formula (1), a crosslinking compound, an acid compound and a solvent. Also, the anti-reflective coating forming composition of the present invention can comprise other polymers, light absorbing compounds and surfactants, and the like.

In the anti-reflective coating forming composition of the present invention, the polymer having the structure of formula (1) is an essential component. The proportion of the polymer having the structure of formula (1) in the solid content in the anti-reflective coating forming composition of the present invention is 50 mass % or more from the viewpoint of anti-reflective effect, preferably 60 mass % or more, for example 50 to 100 mass %, or 60 to 99 mass %, or 70 to 95 mass %. The proportion of the solid content in the anti-reflective coating forming composition of the present invention is not specifically limited so long as each component homogeneously dissolves in the solvent, for example it is 0.5 to 50 mass %, or 1 to 30 mass %, or 3 to 20 mass %. In this specification, the solid content means all components of the anti-reflective coating forming composition from which the solvent component is excluded.

The anti-reflective coating forming composition of the present invention contains the polymer having the structure of formula (1). In formula (1), $A_1, A_2, A_3, A_4, A_5$ and $A_6$ independently of one another are hydrogen atom, methyl or ethyl, $X_1$ is a group of formula (2), (3), (4) or (5), and Q is a group of formula (6) or (7). In formula (2) or (3), $R_1$ and $R_2$ independently of each other are hydrogen atom, $C_{1-6}$alkyl, $C_{3-6}$alkenyl, benzyl or phenyl. Concrete examples of the alkyl include methyl, ethyl, isopropyl, n-butyl and cyclohexyl, etc. Concrete examples of the alkenyl include 2-propenyl and 3-butenyl, etc. In addition, the phenyl may be substituted by a substituent selected from the group consisting of $C_{1-6}$alkyl, halogen atom, $C_{1-6}$alkoxy, nitro, cyano, hydroxy and $C_{1-6}$alkylthio. Concrete examples of the alkyl include groups similar to those mentioned above. Concrete examples of the alkoxy include methoxy, ethoxy, n-pentyloxy, isopropoxy and cyclohexyloxy, etc. Concrete examples of the alkylthio include methylthio, ethylthio, n-pentylthio, isopropylthio and cyclohexylthio, etc. The halogen atom includes fluorine atom, chlorine atom, bromine atom, or iodine atom. In addition, $R_1$ and $R_2$ together may form a ring having 3 to 6 carbon atoms ($C_{3-6}$) including the carbon atom to which $R_1$ and $R_2$ bind. Such a ring includes cyclobutane ring, cyclopentane ring and cyclohexane ring, etc.

In case where $X_1$ is a group of formula (3) in formula (1), the structure thereof is represented by formula (1-3), in case where $X_1$ is a group of formula (4), the structure thereof is represented by formula (14).

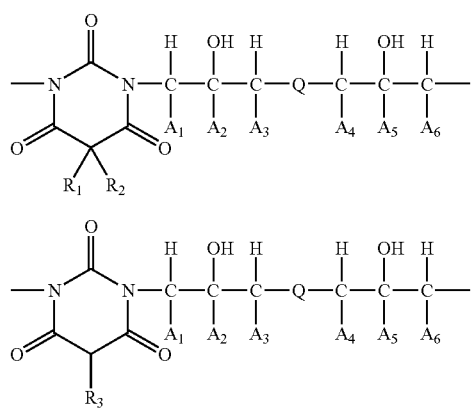

In formula (4), $R_3$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio. Concrete examples of the alkyl, alkenyl, alkoxy and alkylthio include groups similar to those mentioned above.

In formula (6), $Q_1$ is $C_{1-10}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio. Concrete examples of the alkyl, alkoxy and alkylthio include groups similar to those mentioned above. Concrete examples of the alkylene include methylene, ethylene, propylene, n-pentylene, cyclohecylene and 2-methylpropylene, etc. In addition, in case where $Q_1$ is phenylene, naphthylene or anthrylene, the bonding position thereof is not specifically limited. That is, for example there may be cases where phenylene is bonded to 1- and 2-positions, to 1- and 3-positions, or to 1- and 4-positions, where naphthylene is bonded to 1- and 2-positions, to 1- and 4-positions, to 1- and 5-positions, or to 2- and 3-positions, where anthrylene is bonded to 1- and 2-positions, to 1- and 4-positions, or to 9- and 10-positions, and the like, every cases are possible. In addition, $n_0$ and $n_2$ independently of each other are a number of 0 or 1.

In formula (7), $X_2$ is a group of formula (2), (3) or (5). And, in case where $X_2$ is a group of formula (3), the structure thereof is represented by formula (7-3).

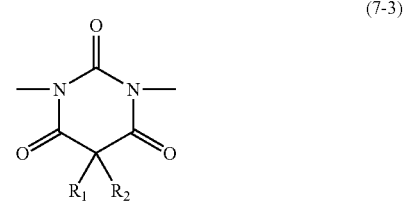

The structure of formula (1) includes for example the groups of formulae (14) to (32).

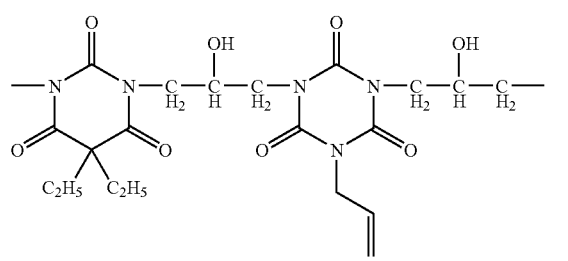

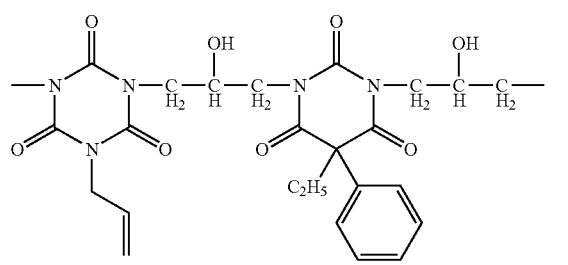

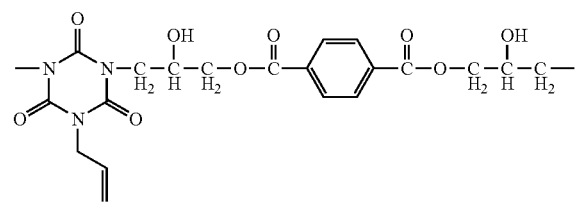

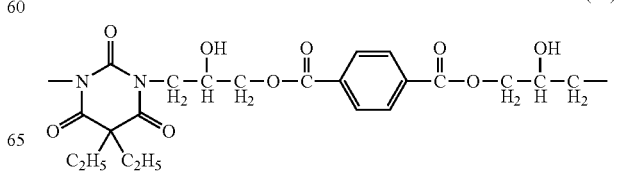

-continued
(18)
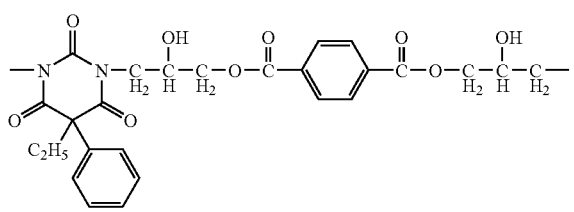
(19)
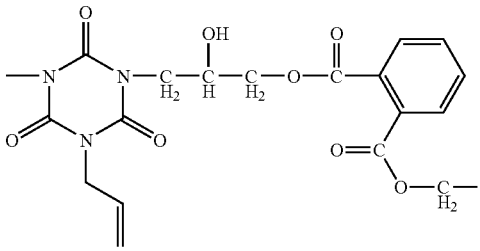
(20)
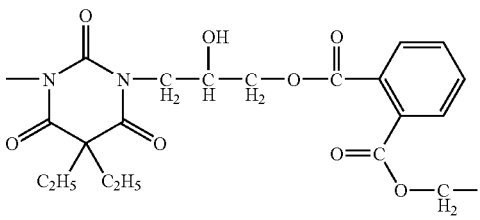
(21)
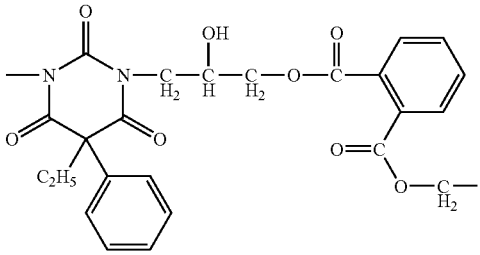
(22)
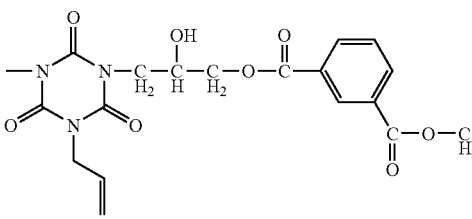
(23)
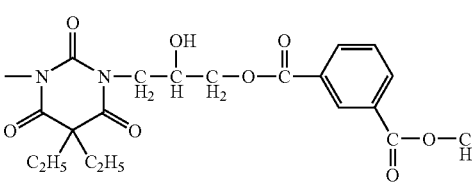
-continued
(24)
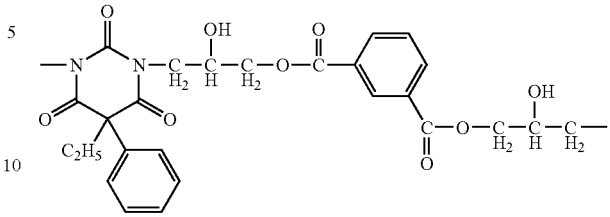
(25)
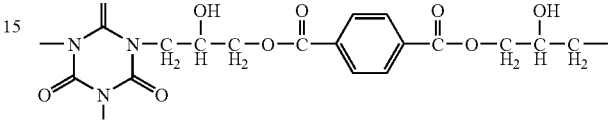
(26)
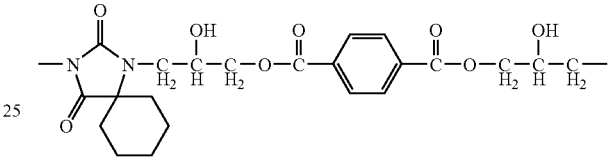
(27)
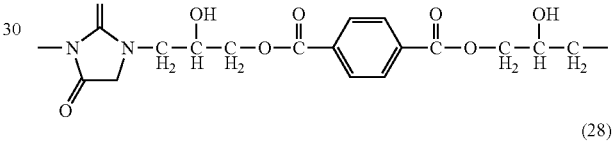
(28)
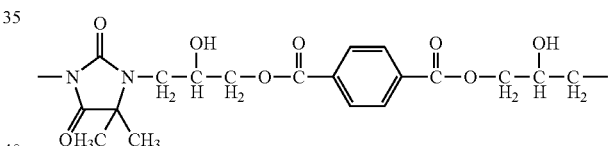
(29)
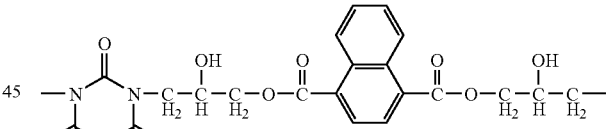
(30)
(31)
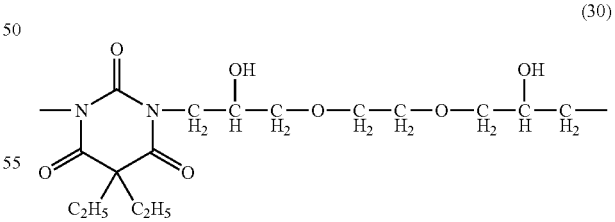

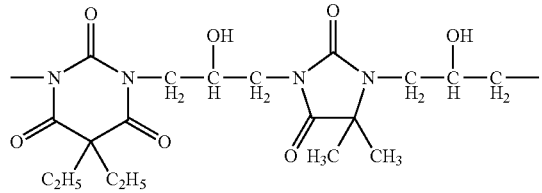

The polymer having the structure of formula (1) contained in the anti-reflective coating forming composition of the present invention can be produced by for example a reaction of a compound of formula (8) with a compound of formula (9). It is preferable to carry out the reaction of a compound of formula (8) with a compound of formula (9) in a solution state dissolved in an organic solvent such as benzene, toluene, xylene, ethyl lactate, butyl lactate, propylene glycol monomethyl ether, propylene glycol monomethyl ether acetate, cyclohexanone and N-methylpyrrolidone, etc. In the reaction, a quaternary ammonium salt such as benzyltriethylammonium chloride, tetrabutylammonium chloride, and tetraethylammonium bromide, etc. can be used as a catalyst. The reaction temperature and reaction time of the reaction depends on the compounds used therefor, the concentration thereof, or the like, but a reaction time ranging from 0.1 to 100 hours or a reaction temperature ranging from 20 to 200° C. is suitably selected. When the catalyst is used, it can be used in an amount of 0.001 to 30 mass % based on the total mass of compounds used from which the organic solvent is excluded.

The proportion of the compound of formula (8) and the compound of formula (9) is a molar ratio of 3:1 to 1:3, preferably 3:2 to 2:3, or 5:4 to 4:5, or 1:1 shown in the compound of formula (8): the compound of formula (9).

The reaction of the compound of formula (8) with the compound of formula (9) can be carried out as follows, for example. The compound of formula (8) and the compound of formula (9) are dissolved in a suitable organic solvent in a molar ratio of 5:4 to 4:5, or 1:1 so that total concentration of both compounds is 10 to 40 mass % or 15 to 35 mass %. Then, a quaternary ammonium salt such as benzyltriethylammonium chloride or the like is added in an amount of 0.1 to 5 mass % or 0.5 to 3 mass % based on the total mass of the compounds used for the reaction except the organic solvent. Thereafter, the reaction can be carried out at a reaction temperature of 80 to 150° C. for a reaction time of 3 to 30 hours. By altering the reaction temperature and reaction time, the weight average molecular weight of the obtained polymer can be controlled. The reaction of the compound of formula (8) with the compound of formula (9) causes epoxy ring opening reaction between two reaction moieties (N—H moieties) of the compound of formula (8) and respect epoxy ring moieties of the compound of formula (9). Consequently, polyaddition reaction between the compound of formula (8) and the compound of formula (9) occurs to form a polymer having a structure of formula (1). It is assumed that the polymer has a repeating structural unit of formula (1). When only the compound of formula (8) and the compound of formula (9) are used for the production of the polymer having the structure of formula (1), it is assumed that the obtained polymer has essentially only the structure of formula (1) as a repeating structural unit except the end portion of the polymer, as shown in the following reaction equation (R-1).

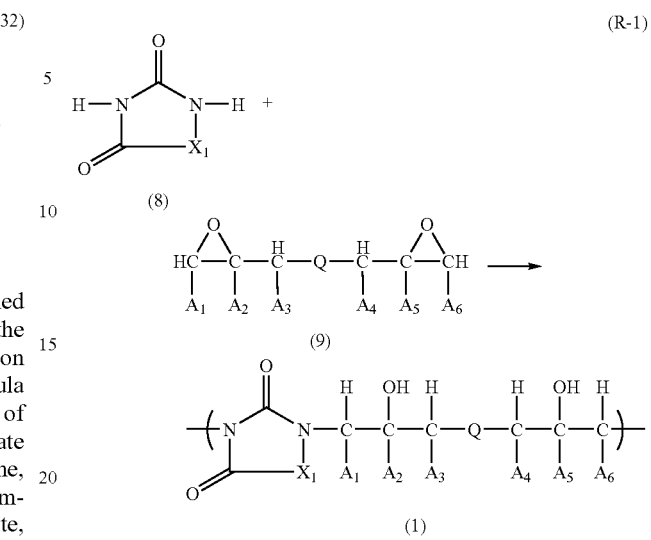

The compound of formula (8) used for the production of the polymer having the structure of formula (1) includes for example hydantoin compounds such as hydantoin, 5,5-diphenyl hydantoin, 5,5-dimethyl hydantoin, 5-ethyl hydantoin, 5-benzyl hydantoin, 4-ethyl-5-phenyl hydantoin, 5-methyl hydantoin, 5,5-tetramethylene hydantoin, 5,5-pentamethylene hydantoin, 5-(4-hydroxybenzyl) hydantoin, 5-phenyl hydantoin, 5-hydroxymethyl hydantoin, and 5-(2-cyanoethyl) hydantoin and the like. In addition, the compound of formula (8) includes for example barbituric acid compounds such as 5,5-diethyl barbituric acid, 5,5-diallyimalonyl urea, 5-ethyl-5-isoamyl barbituric acid, 5-allyl-5-isobutyl barbituric acid, 5-allyl-5-isopropyl barbituric acid, 5-β-bromoallyl-5-sec-butyl barbituric acid, 5-ethyl-5-(1-methyl-1-butenyl) barbituric acid, 5-isopropyl-5-β-bromoallyl barbituric acid, 5-(1-cyclohexyl)-5-ethylmalonyl urea, 5-ethyl-5-(1-methyl-butyl) malonyl urea, 5,5-dibromo barbituric acid, 5-phenyl-5-ethyl barbituric acid, and 5-ethyl-5-n-butyl barbituric acid and the like. Further, the compound of formula (8) includes for example isocyanuric acid compounds such as monoallyl isocyanuric acid, monomethyl isocyanuric acid, monopropyl isocyanuric acid, monoisopropyl isocyanuric acid, monophenyl isocyanuric acid, monobenzyl isocyanuric acid, monochloro isocyanuric acid, and monoethyl isocyanuric acid, and the like.

A concrete example of formula (8) is parabanic acid.

The compound of formula (9) used for the production of the polymer having the structure of formula (1) includes for example terephthalic acid diglycidyl ester compounds such terephthalic acid diglycidyl ester, 2,5-dimethylterephthalic acid diglycidyl ester, 2,5-diethylterephthalic acid diglycidyl ester, 2,3,5,6-tetrachloroterephthalic acid diglycidyl ester, 2,3,5,6-tetrabromoterephthalic acid diglycidyl ester, 2-nitroterephthalic acid diglycidyl ester, 2,3,5,6-tetrafluoroterephthalic acid diglycidyl ester, 2,5-dihydroxyterephthalic acid diglycidyl ester, 2,6-dimethylterephthalic acid diglycidyl ester, and 2,5-dichloroterephthalic acid diglycidyl ester, and the like. It also includes isophthalic acid diglycidyl ester compound such as isophthalic acid diglycidyl ester, 2,3-dichloroisophthalic acid diglycidyl ester, 3-nitroisophthalic acid diglycidyl ester, 2-bromoisophthalic acid diglycidyl ester, 2-hydroxyisophthalic acid diglycidyl ester, 3-hydroxyisophthalic acid diglycidyl ester, 2-methoxyisophthalic acid diglycidyl ester, and 5-phenylisophthalic acid diglycidyl ester, and the like. Further, it includes phthalic acid diglycidyl ester compounds such as phthalic acid diglycidyl ester, 3-nitrophthalic acid diglycidyl ester, 3,4,5,6-tetrachloro phthalic acid diglycidyl ester, 4,5-dichlorophthalic acid diglycidyl ester, 4-hydroxy phthalic acid diglycidyl ester, 4-nitrophthalic acid diglycidyl ester, 4-methylphthalic acid diglycidyl ester, and 3,4,5,6-tetrafluoro phthalic acid diglycidyl ester, and the like. The compound of formula (9) also includes for example diglycidyl ester compounds such as 2,6-naphthalene dicarboxylic acid diglycidyl ester, 1,2-naphthalene dicarboxylic acid diglycidyl ester, 1,4-naphthalene dicarboxylic acid diglycidyl ester, 1,8-naphthalene dicarboxylic acid diglycidyl ester, 1,2-cyclohexanen dicarboxylic acid diglycidyl ester, 1,3-cyclohexane dicarboxylic acid diglycidyl ester, 1,4-cylcohexane dicarboxylic diglycidyl ester acid and anthracene-9,10-dicarboxylic acid diglycidyl ester, and the like.

In addition, the compound of formula (9) includes for example diglycidyl ether compounds such as 1,5-naphthalenediol-diglycidyl ether, 2,6-naphthalenediol-diglycidyl ether, 1,2-naphthalenediol-diglycidyl ether, 1,4-naphthalenediol-diglycidyl ether, 1,8-naphthalenediol-diglycidyl ether, anthracene-9,10-diol diglycidyl ester, diglycidylresorcinol, diglycidylcatechol, 1,4-benzenedioldiglycidyl ether, 1,4-butanediol diglycidyl ether, 1,6-hexanediol diglycidyl ether, 1,3-propanediol diglycidyl ether, 1,5-pentanediol diglycidyl ether and ethyleneglycol diglycidyl ether, and the like.

Further, the compound of formula (9) includes for example diglycidyl hydantoin compounds such as 1,3-diglycidyl hydantoin, 1,3-diglycidyl-5,5-diphenyl hydantoin, 1,3-diglycidyl-5,5-dimethyl hydantoin, 1,3-diglycidyl-5-methyl hydantoin, 1,3-diglycidyl-5-ethyl-5-phenyl hydantoin, 1,3-diglycidyl-5-benzyl hydantoin, 1,3-diglycidyl-5-hydantoin acetic acid, 1,3-diglycidyl-5-ethyl-5-methyl hydantoin, 1,3-diglycidyl-5-methyl hydantoin, 1,3-diglycidyl-5,5-tetramethylene hydantoin, 1,3-diglycidyl-5,5-pentamethylene hydantoin, 1,3-diglycidyl-5-(4-hydroxybenzyl) hydantoin, 1,3-diglycidyl-5-phenyl hydantoin, 1,3-diglycidyl-5-hydroxymethyl-hydantoin, and 1,3-diglycidyl-5-(2-cyanoethyl) hydantoin, and the like.

The compound of formula (9) also includes for example diglycidyl barbituric acid compounds such as 1,3-diglycidyl-5,5-diethyl barbituric acid, 1,3-diglycidyl-5-phenyl-5-ethyl barbituric acid, 1,3-diglycidyl-5-ethyl-5-isoamyl barbituric acid, 1,3-diglycidyl-5-allyl-5-isobutyl barbituric acid, 1,3-diglycidyl-5-allyl-5-isopropyl barbituric acid, 1,3-diglycidyl-5-β-bromoallyl-5-sec-butyl barbituric acid, 1,3-diglycidyl-5-ethyl-5-(1-methyl-1-butenyl) barbituric acid, 1,3-diglycidyl-5-isopropyl-5-β-bromoallyl barbituric acid, 1,3-diglycidyl-5-(1-cyclohexyl)-5-ethylmalonyl urea, 1,3-diglycidyl-5-ethyl-5-(1-methylbutyl) malonyl urea, 1,3-diglycidyl-5,5-diallyl malonyl urea diglycidyl, and 1,3-diglycidyl-5-ethyl-5-n-butyl barbituric acid and the like.

In the production of the polymer having the structure of formula (1), only one kind of the compound of formula (8) and the compound of formula (9) can be used, but they can be used in a combination of two or more kinds thereof. And, for example when monoallyl isocyanuric acid as the compound of formula (8) and terephthalic acid diglycidyl ester as the compound of formula (9) are used, it is assumed that the obtained polymer has the structure of formula (1.6) as a repeating structural unit. In addition, when 5,5-diethylbarbituric acid as the compound of formula (8) and two kinds of terephthalic acid diglycidyl ester and ethylene glycol diglycidyl ether as the compound of formula (9) are used, it is assumed that the obtained polymer has the structure of formulae (17) and (30) as a repeating structural unit.

The polymer having the structure of formula (1) contained in the anti-reflective coating forming composition of the present invention can be also produced by a reaction of a compound of formula (10) with a compound of formula (11).

The reaction of a compound of formula (10) with a compound of formula (11) can be carried out in a similar condition to the reaction of the compound of formula (8) with the compound of formula (9).

The proportion of the compound of formula (10) and the compound of formula (11) used in the reaction is a molar ratio of 3:1 to 1:3, preferably 3:2 to 2:3, or 5:4 to 4:5, or 1:1 shown in the compound of formula (10): the compound of formula (11).

The reaction of the compound of formula (10) with the compound of formula (11) can be carried out as follows, for example. The compound of formula (10) and the compound of formula (11) are dissolved in a suitable organic solvent in a molar ratio of 5:4 to 4:5, or 1:1 so that total concentration of both compounds is 10 to 40 mass % or 15 to 35 mass %. Then, a quaternary ammonium salt such as benzyltriethylammonium chloride or the like is added in an amount of 0.1 to 5 mass % or 0.5 to 3 mass % based on the total mass of the compounds used for the reaction except the organic solvent. Thereafter, the reaction can be carried out at a reaction temperature of 80 to 150° C. for a reaction time of 5 to 30 hours. By altering the reaction temperature and reaction time, the weight average molecular weight of the obtained polymer can be controlled.

The reaction of the compound of formula (10) with the compound of formula (11) causes epoxy ring opening reaction between two reaction moieties (N—H moiety or O—H moiety) of the compound of formula (11) and respective epoxy ring moieties of the compound of formula (10). Consequently, polyaddition reaction between the compound of formula (10) and the compound of formula (11) occurs to form a polymer having a structure of formula (1). It is assumed that the polymer has a repeating structural unit of formula (1).

When only the compound of formula (10) and the compound of formula (11) are used for the production of the polymer having the structure of formula (1), it is assumed that the obtained polymer has essentially only the structure of formula (1) as a repeating structural unit except the end portion of the polymer, as shown in the following reaction equation (R-2).

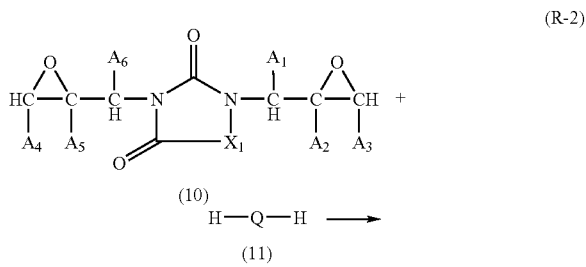

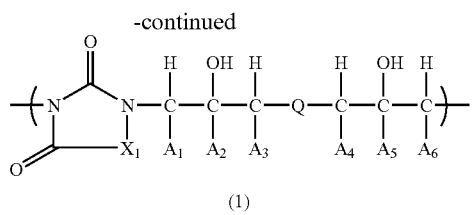

(1)

Concrete examples of the compound of formula (10) used for the production of the polymer having the structure of formula (1) are the diglycidyl hydantoin compounds and the diglycidyl barbituric acid compounds in the concrete examples of formula (9). Also it includes diglycidyl isocyanuric acid compounds such as monoallyl diglycidyl isocyanuric acid, monoethyl diglycidyl isocyanuric acid, monopropyl diglycidyl isocyanuric acid, monoisopropyl diglycidyl isocyanuric acid, monophenyl diglycidyl isocyanuric acid, monobromo diglycidyl isocyanuric acid and monomethyl diglycidyl isocyanuric acid, and the like.

Concrete examples of the compound of formula (11) used for the production of the polymer having the structure of formula (1) are parabanic acid, the hydantoin compounds and the barbituric acid compounds in the concrete examples of formula (8).

The compound of formula (11) includes for example terephthalic acid compounds such as terephthalic acid, 2,5-dimethylterephthalic acid, 2,5-diethylterephthalic acid, 2,3,5,6-tetrachloroterephthalic acid, 2,3,5,6-tetrabromoterephthalic acid, 2-nitroterephthalic acid, 2,3,5,6-tetrafluoroterephthalic acid, 2,5-dihydroxyterephthalic acid, 2,6-dimethylterephthalic acid, and 2,5-dichloroterephthalic acid, and the like. Also it includes isophthalic acid compounds such as isophthalic acid, 2,3-dichloroisophthalic acid, 3-nitroisophthalic acid, 2-bromoisophthalic acid, 2-hydroxyisophthalic acid, 3-hydroxyisophthalic acid, 2-methoxyisophthalic acid, and 5-phenylisophthalic acid, and the like. In addition, it includes phthalic acid compounds such as phthalic acid, 3-nitrophthalic acid, 3,4,5,6-tetrachlorophthalic acid, 4,5-dichlorophthalic acid, 4-hydroxyphthalic acid, 4-nitrophthalic acid, 4-methylphthalic acid, and 3,4,5,6-tetrafluorophthalic acid, and the like.

The compound of formula (11) also includes for example carboxylic acid compounds such as 2,6-naphthalene dicarboxylic acid, 1,2-naphthalene dicarboxylic acid, 1,4-naphthalene dicarboxylic acid, 1,8-naphthalene dicarboxylic acid, anthracene-9,10-dicarboxylic acid, 1,2-cyclohexane dicarboxylic acid, 1,3-cyclohexane dicarboxylic acid, 1,4-cyclohexane dicarboxylic acid, 1,3-propane dicarboxylic acid and 4-hydroxybenzoic acid, and the like. It also includes hydroxy compounds such as 1,5-naphthalenediol, 2,6-naphthalenediol, 1,2-naphthalenediol, 1,4-naphthalenediol, 1,8-naphthalenediol, resorcinol, catechol, 1,2-cyclohexanediol, 1,3-cyclohexanediol, 1,4-cyclohexanediol, 1,4-benzenediol, 1,4-butanediol, 1,6-hexanediol, 1,3-propnanediol, 1,5-pentanediol and ethylene glycol, and the like.

In the production of the polymer having the structure of formula (1), only one kind of the compound of formula (10) and the compound of formula (11) can be used, but they can be used in a combination of two or more kinds thereof. And, for example when monoallyl diglycidyl isocyanuric acid as the compound of formula (10) and 5,5-diethylbarbituric acid as the compound of formula (11) are used, it is assumed that the obtained polymer has the structure of formula (14) as a repeating structural unit. In addition, for example when monoallyl diglycidyl isocyanuric acid as the compound of formula (10) and two kinds of terephthalic acid and 5,5-diethyl barbituric acid as the compound of formula (11) are used, it is assumed that the obtained polymer has the structure of formulae (14) and (16) as a repeating structural unit.

The polymer having the structure of formula (1) contained in the anti-reflective coating forming composition of the present invention includes a polymer having a structure of formula (12), or a polymer having a structure of formula (13). In formula (13), Y is $C_{1-6}$alkyl, halogen atom, $C_1$-alkoxy, nitro, cyano, hydroxy or $C_{1-6}$alkylthio, and m is an integer of 0 to 4. In case where m is 2 to 4, the Ys may be identical with or different from each other. In the meantime, in case where m is 0 to 3, (4-m) other positions are hydrogen atoms.

Concrete examples of the alkyl include methyl, ethyl, isopropyl, n-butyl and cyclohexyl, etc. Concrete examples of the alkoxy include methoxy, ethoxy, n-pentyloxy, isopropoxy and cyclohexyloxy, etc. Concrete examples of the alkylthio include methylthio, ethylthio, n-pentylthio, isopropylthio and cyclohexylthio, etc. The halogen atom is fluorine atom, chlorine atom, bromine atom, or iodine atom.

The polymer having the structure of formula (12) can be produced for example by a reaction of a compound of formula (33) with a compound of formula (34).

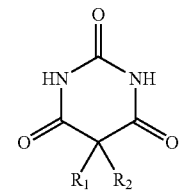

(33)

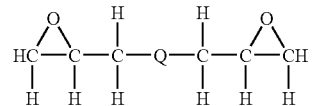

(34)

The polymer having the structure of formula (12) can be produced for example by a reaction of a compound of formula (35) with a compound of formula (11).

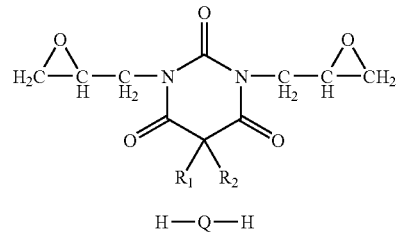

(35)

H—Q—H (11)

Concrete examples of the compound of formula (33) include the barbituric acid compounds mentioned above. Concrete examples of the compound of formula (35) include the diglycidylbarbituric acid compounds mentioned above. Concrete examples of the compound of formula (34) include the exemplified compounds of formula (9) wherein all of $A_1$, $A_2$, $A_3$, $A_4$, $A_5$ and $A_6$ are hydrogen atoms. When only the compound of formula (33) and the compound of formula (34) are used for the production of the polymer having the structure of formula (12), it is assumed that the obtained polymer has essentially only the structure of formula (12) as a repeating structural unit except the end portion of the polymer, similarly to the above-mentioned reaction equation (R-1) or (R-2).

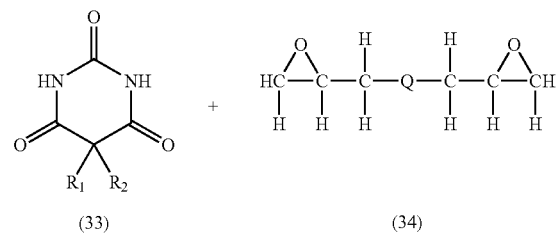

(33)    (34)

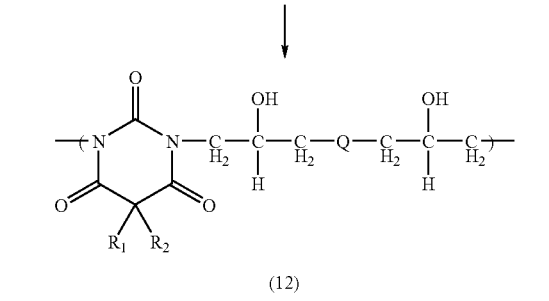

(12)

(35)    (11)

The polymer having the structure of formula (13) can be produced for example by a reaction of a compound of formula (8) with a compound of formula (37). In addition, the polymer having the structure of formula (13) can be produced for example by a reaction of a compound of formula (36) with a compound of formula (38). Concrete examples of the compound of formula (36) include the exemplified compounds of formula (10) wherein all of $A_1$, $A_2$, $A_3$, $A_4$, $A_5$ and $A_6$ are hydrogen atoms. Concrete examples of the compound of formula (37) include the above-mentioned terephthalic acid diglycidyl ester compounds, isophthalic acid diglycidyl ester compounds, and phthalic acid diglycidyl ester compounds. Concrete examples of the compound of formula (38) include the above-mentioned terephthalic acid compounds, isophthalic acid compounds, and phthalic acid compounds.

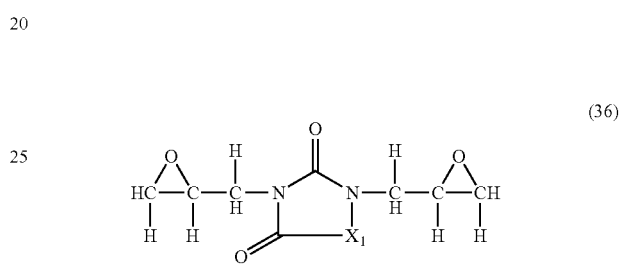

(36)

When only the compound of formula (8) and the compound of formula (37) or only the compound of formula (36) and the compound of formula (38) are used for the production of the polymer having the structure of formula (13), it is assumed that the obtained polymer has essentially only the structure of formula (13) as a repeating structural unit except the end portion of the polymer, similarly to the above-mentioned reaction equations (R-1) and (R-2).

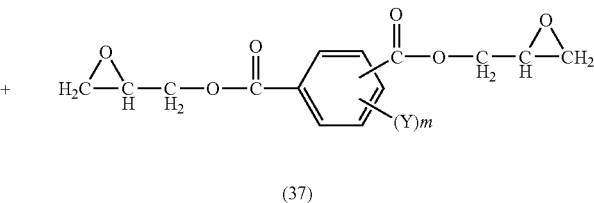

(8)    (37)

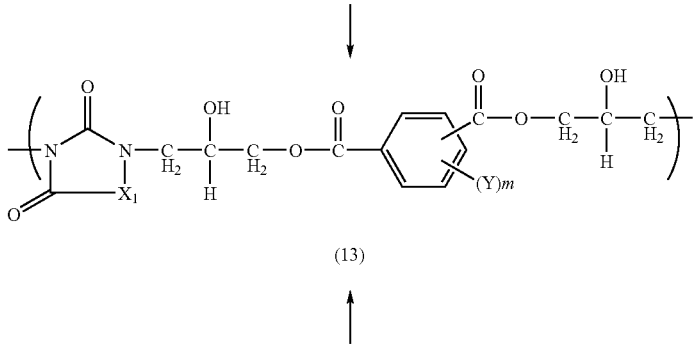

(13)

-continued

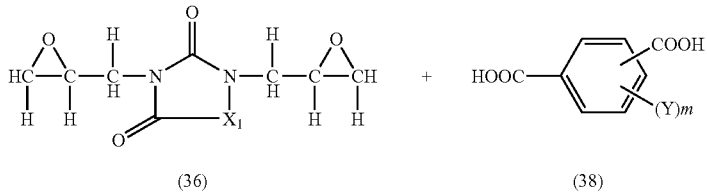

(36)                (38)

The polymer having the structure of formula (1) contained in the anti-reflective coating forming composition of the present invention can be produced by a reaction of a compound of formula (8) with a compound of formula (9) or a reaction of a compound of formula (10) with a compound of formula (11), as mentioned above. In these reactions, in addition to the compounds of formulae (8) to (11), other compounds such as compounds having 1 to 4 groups that can be reacted with an epoxy, for example hydroxy, thiol, carboxy and amino, etc., and compounds having 1 to 4 epoxy groups and the like, can be used together, if necessary. When these other compounds are used, the used amount thereof is for example 1 to 100 mass parts, or 5 to 50 mass parts, or 10 to 25 mass parts based on 100 mass parts of the total amount of the compound of formula (8) and the compound of formula (9) or the compound of formula (10) and the compound of formula (11) that used in the reaction. The compounds having 1 to 4 groups that can be reacted with an epoxy, for example hydroxy, thiol, carboxy and amino, etc. include for example ethane dithiol, 1,3-propane dithiol, 1,4-benzene dithiol, 2-dimethylamino-1,3,5-triazine-4,6-dithiol, tris-2-carboxyethylisocyanuric acid, tris-3-carboxypropylisocyanuric acid, ethylene diamine, phenylene diamine, glycerol, triethanolamine, aminophenol and 4,4'-dihydroxydiphenylsulfone, and the like.

The compounds having 1 to 4 epoxy groups include for example tris(2,3-epoxypropyl) isocyanuric acid, tetraglycidyl diaminodiphenylmethane, bisphenol-A-diglycidyl ether, and bisphenol-S-diglycidyl ether, and the like.

In the anti-reflective coating forming composition of the present invention, the polymer having the structure of formula (1) may be used singly or in a combination of two or more polymers.

The polymer having the structure of formula (1) contained in the anti-reflective coating forming composition of the present invention has a molecular weight of for example 1000 to 200000, or 3000 to 100000, or 4000 to 30000, or 5000 to 20000 in terms of weight average molecular weight.

The anti-reflective coating forming composition of the present invention can contain a crosslinking compound. The crosslinking compound is not specifically limited, but crosslinking compounds having at least two crosslink-forming substituents are preferably used. For example, compounds having two or more, for example 2 to 6 crosslinkable groups such as isocyanate groups, epoxy groups, hydroxymethylamino groups, and alkoxymethylamino groups, etc. can be used.

The crosslinking compounds include nitrogen-containing compounds having one to six or two to four nitrogen atoms substituted with methylol or alkoxymethyl such as methoxymethyl, ethoxymethyl, butoxymethyl, and hexyloxymethyl or the like.

Concretely they include nitrogen-containing compounds such as hexamethoxymethyl melamine, tetramethoxymethyl benzoguanamine, 1,3,4,6-tetrakis(methtoxymethyl)glycoluril, 1,3,4,6-tetrakis(butoxymethyl)glycoluril, 1,3,4,6-tetrakis(hydroxymethyl)glycoluril, 1,3-bis(hydroxymethyl)urea, 1,1,3,3-tetrakis(butoxymethyl)urea, 1,1,3,3-tetrakis(methoxymethyl)urea, 1,3-bis(hydroxymethyl)-4,5-dihydroxy-2-imidazolinone, and 1,3-bis(methoxymethyl)-4,5-dimethoxy-2-imidazolinone, etc. In addition, the crosslinking compounds may be commercially available nitrogen-containing compounds such as methoxymethyl type melamine compounds manufactured by Mitsui Cytec Co., Ltd. (trade name: Cymel 300, Cymel 301, Cymel 303, Cymel 350), butoxymethyl type melamine compounds (trade name: Mycoat 506, Mycoat 508), glycoluril compounds (trade name: Cymel 1170, Powderlink 1174), methylated urea resins (trade name: UFR 65), butylated urea resins (trade name: UFR300, U-VAN 10S60, U-VAN 10R, U-VAN 11HV), urea/formaldehyde resins manufactured by Dainippon Ink and Chemistry Incorporated (trade name: Beckamine J-300S, Beckamine P-955, Beckamine N) and the like.

In addition, the crosslinking compounds that can be used include polymers produced by use of acrylamide compounds or methacrylamide compounds substituted with hydroxymethyl group or alkoxymethyl group, such as N-hydroxymethylacrylamide, N-methoxymethylmethacrylamide, N-ethoxymethylacrylamide, and N-butoxymethylmethacrylamide, etc. Such polymers include for example poly(N-butoxymethylacrylamide), a copolymer of N-butoxymethylacrylamide with styrene, a copolymer of N-hydroxymethylmathacrylamide with methylmethacrylate, a copolymer of N-ethoxymethymethacrylamide with benzylmethacrylate, and a copolymer of N-butoxymethylacrylamide, benzylmethacrylate and 2-hydroxypropylmethacrylate, and the like.

These crosslinking compounds can take place crosslinking reaction due to self-condensation. In addition, they can take place crosslinking reaction with a hydroxy on the polymer having the structure of formula (1). Due to such a crosslinking reaction, the formed anti-reflective coating becomes tough, and has a low solubility in organic solvents. The crosslinking compounds may be used singly or in a combination of two or more.

The anti-reflective coating forming composition of the present invention can contain an acid compound. The acid compound includes for example sulfonic acid compounds such as p-toluene sulfonic acid, trifluoromethane sulfonic acid, pyridinium-p-toluenesulfonate, salicylic acid, camphor sulfonic acid, sulfosalicylic acid, 4-chlorobenzene sulfonic acid, 4-hydroxybenzene sulfonic acid, benzene disulfonic acid, 1-naphthalene sulfonic acid and pyridinium-1-naphthalene sulfonic acid, etc., and carboxylic acid compounds such as salycylic acid, sulfosalicylic acid, citric acid, benzoic acid, and hydroxy benzoic acid, etc.

In addition, the acid compounds include acid generators that generate an acid with heat or light, such as 2,4,4,6-tetrabromocyclohexadienone, benzointosylate, 2-nitrobenzyltosylate, bis(phenylsulfonyl)diazomethane, p-trifluoromethylbenzene sulfonic acid-2,4-dinitrobenzyl, phenyl-bis(trichloromethyl)-s-triazine, and N-hydroxysuccinimide trifluoromethanesulfonate, etc. The acid compounds also include iodonium salt type acid generators such as diphenyliodonium hexafluorophosphate, diphenyliodonium trifluoromethane sulfonate, diphenyliodonium nonafluoro-n-butane sulfonate, diphenyliodonium perfluoro-n-octane sulfonate, diphenyliodonium camphor sulfonate, bis(4-tert-butylphenyl)iodonium camphor sulfonate and bis(4-tert-butylphenyl)iodoniumtrifluoromethane sulfonate, and the like, sulfonium salt type acid generators such as triphenylsulfonium hexafluoroantimonate, triphenylsulfonium nonafluoro n-butanesulfonate, triphenylsulfonium camphor sulfonate and triphenylsulfonium trifluoromethane sulfonate, and the like, and sulfoneimide compound type acid generators such as N-(trifluoromethanesulfonyloxy)succinimide, N-(nonafluoro n-butanesulfonyloxy)succinimide, N-(camphorsulfonyloxy)succinimide and N-(trifluoromethanesulfonyloxy)naphthalimide. As the acid compound, the sulfonic acid compounds, iodonium salt type acid generators, sulfonium salt type acid generators or sulfoneimide compound type acid generators are preferably used. The acid compounds may be used singly or in a combination of two or more. For example, as the acid compound, only sulfonic acid compounds may be used. In addition, as the acid compound, a combination of a sulfonic compound and a iodonium salt type acid generator, or a combination of a sulfonic compound and a sulfonium salt type acid generator, or a combination of a sulfonic acid and a sulfoneimide compound type acid generator can be used.

When the anti-reflective coating forming composition of the present invention contains the polymer having the structure of formula (1) and the crosslinking compound, the contained amount thereof in the solid content is as follows: that of the polymer having the structure of formula (1) is for example 50 to 99 mass %, or 60 to 90 mass %, and that of the crosslinking compound is for example 1 to 50 mass % or 10 to 40 mass %.

When the anti-reflective coating forming composition of the present invention contains the polymer having the structure of formula (1), the crosslinking compound and the acid compound, the contained amount thereof in the solid content is as follows: that of the polymer having the structure of formula (1) is for example 50 to 99 mass %, or 60 to 90 mass %, that of the crosslinking compound is for example 0.5 to 40 mass % or 0.5 to 35 mass %, and that of the acid compound is for example 0.1 to 10 mass % or 0.1 to 5 mass %.

The anti-reflective coating forming composition of the present invention can contain arbitrary components such as other polymers, light absorbing compounds, rheology controlling agents and surfactants, and the like, if desired. The other polymers include polymers produced from addition polymerizable compounds. They include addition polymerized polymers from addition polymerizable compounds such as acrylic acid ester compounds, methacrylic acid ester compounds, acrylamide compounds, methacrylamide compounds, vinyl compounds, styrene compounds, maleimide compounds, maleic anhydride, and acrylonitrile, etc. In addition, they include for example polyester, polyamide, polyimide, polyamic acid, polycarbonate, polyether, phenol novolak, cresol novolak, and naphthol novolak, etc. When the other polymer is used, the used amount thereof is for example 0.1 to 40 mass % in the solid content.

The light absorbing compounds can be used without any limitation so long as they have a high absorption for light at photosensitive characteristic wavelength region of photosensitive components in a photoresist layer provided on the anti-reflective coating. The light absorbing compounds include for example benzophenone compounds, benzotriazole compounds, azo compounds, naphthalene compounds, anthracene compounds, anthraquinone compounds, triazine compounds, triazine trione compounds, quinoline compounds, and the like. Concrete examples are for example 1-naphthalene carboxylic acid, 2-naphthalene carboxylic acid, 1-napththol, 2-naphthol, naphthyl acetic acid, 1-hydroxy-2-naphthalene carboxylic acid, 3-hydroxy-2-naphthalene carboxylic acid, 3,7-dihydroxy-2-naphthalene carboxylic acid, 6-bromo-2-hydroxynaphthalene, 2,6-naphthalene dicarboxylic acid, 9-anthracene carboxylic acid, 10-bromo-9-anthracene carboxylic acid, anthracene-9,10-dicarboxylic acid, 1-anthracene carboxylic acid, 1-hydroxyanthracene, 1,2,3-anthracene triol, 9-hydroxymethylanthracene, 2,7,9-anthracene triol, benzoic acid, 4-hydroxybenzoic acid, 4-bromobenzoic acid, 3-iodobenzoic acid, 2,4,6-tribromophenol, 2,4,6-tribromoresorcinol, 3,4,5-tri-iodo benzoic acid, 2,4,6-tri-iodo-3-aminobenzoic acid, 2,4,6-tri-iodo-3-hydroxybenzoic acid, and 2,4,6-tribromo-3-hydroxybenzoic acid, etc. When the light absorbing compound is used, the used amount thereof is for example 0.1 to 40 mass % in the solid content.

The rheology controlling agents include for example phthalic acid compounds such as dimethyl phthalate, diethyl phthalate, diisobutyl phthalate, dihexyl phthalate, butyl isodecyl phthalate, or the like, adipic acid compounds such as di-n-butyl adipate, diisobutyl adipate, diisooctyl adipate, octyldecyl adipate, or the like, maleic acid compounds such as di-n-butyl maleate, diethyl maleate, dinonyl maleate, or the like, oleic acid compounds such as methyl oleate, butyl oleate, tetrahydrofurfuryl oleate, or the like, stearic acid compounds such as n-butyl stearate, glyceryl stearate, or the like. When the rheology controlling agent is used, the used amount thereof is for example 0.001 to 10 mass % in the solid content.

The surfactants include for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc., polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The surfactants may be added singly or in combination of two or more. When the surfactant is used, the used amount thereof is for example 0.0001 to 5 mass % in the solid content.

The solvent used in the anti-reflective coating forming composition of the present invention is not specifically limited so long as it can dissolve the solid content. Such solvents include for example ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monoethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate, etc. These solvents are used singly or in combination of two or more. Further, high boiling solvents such as propylene glycol monobutyl ether or propylene glycol monobutyl ether acetate, etc. may be mixed and used.

Hereinafter, the utilization of the anti-reflective coating forming composition of the present invention is described.

The anti-reflective coating forming composition of the present invention is applied on a semiconductor substrate (for example, silicon/silicon dioxide coat substrate, silicon nitride substrate, glass substrate, and ITO substrate, etc.) by a suitable coating method, for example, with a spinner, a coater or the like, and thereafter the substrate is baked to fabricate an anti-reflective coating. The conditions of baking are suitably selected from baking temperature of 80 to 250° C. and baking time of 0.3 to 60 minutes. Preferably the baking temperature is 130 to 250° C. and the baking time is 0.5 to 5 minutes. The thickness of the anti-reflective coating is for example 0.01 to 3.0 µm, or preferably for example 0.03 to 1.0 µm, or 0.03 to 0.5 µm, or 0.05 to 0.2 µm.

Then, a photoresist layer is formed on the anti-reflective coating. The formation of the photoresist layer can be conducted by well-known process, that is, by application of a photoresist composition solution on the anti-reflective coating and baking.

The photoresist to be coated and formed on the anti-reflective coating of the present invention is not specifically limited so long as it is sensitive to an exposure light, and any of negative type and positive type photoresists can be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular weight compound which is decomposed with an acid and increases the alkali dissolution rate of the photoresist, and a chemically-amplified photoresist consisting of a photoacid generator, a binder having a group which is decomposed with an acid and increases the alkali dissolution rate, and a low molecular weight compound which is decomposed with an acid and increases the alkali dissolution rate of the photoresist. Also, it includes fluorine atom-containing polymer type photoresist as mentioned in for example, Proc. SPIE, Vol. 3999, 330-334 (2000), Proc. SPIE, Vol. 3999, 357-364 (2000), or Proc. SPIE, Vol. 3999, 365-374 (2000).

Subsequently, exposure to light is carried out through a predetermined mask. For the exposure to light, KrF excimer laser beam (wavelength 248 nm), ArF excimer laser beam (wavelength 193 nm) and F2 excimer laser beam (wavelength 157 nm), etc. can be used. After the exposure, post exposure bake may be performed, if necessary. The post exposure bake is conducted by suitably selecting from a heating temperature of 70 to 150° C. and a heating time of 0.3 to 10 minutes.

Next, development is conducted by use of a developer. For example in case where a positive type photoresist is used, the development results in removal of exposed part of the photoresist and forming of photoresist pattern. The developer includes for example alkaline aqueous solution e.g., an aqueous solutions of alkali metal hydroxide such as potassium hydroxide, sodium hydroxide or the like, aqueous solution of quaternary ammonium hydroxide such as tetraethylammonium hydroxide, tetraethylammonium hydroxide, choline or the like, amine aqueous solution such as ethanolamine, propylamine, ethylenediamine or the like. Further, surfactants can be added in these developers. The condition of development is suitably selected from a temperature of 5 to 50° C. and a time of 10 to 300 seconds.

Then, removal of the anti-reflective coating and processing of the semiconductor substrate are conducted by using the photoresist pattern formed as mentioned above as a protective coating. The removal of the anti-reflective coating is conducted by use of a gas such as tetrafluoromethane, perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride and chlorine trifluoride, etc. Before forming the anti-reflective coating of the present invention on a semiconductor substrate, a flattening coating or a gap-fill material layer may be formed. In case where semiconductor substrates having large steps or holes are used, it is preferable that the flattening coating or the gap-fill material layer is formed.

The semiconductor substrates on which the anti-reflective coating forming composition of the present invention is applied may be substrates on which an inorganic anti-reflective coating is formed by CVD method or the like, and the anti-reflective coating of the present invention can be formed thereon.

Further, the anti-reflective coating of the present invention can be used as a layer for preventing an interaction between the substrate and the photoresist, as a layer having a function that prevents an adverse effect against the substrate by the material used for the photoresist or by substances formed on exposure to light of the photoresist, as a layer having a function that prevents diffusion of substances formed in the substrate on baking under heating to the upper layer photoresist, and as a barrier layer for reducing any poisoning effect of the photoresist layer by the semiconductor substrate dielectric layer.

In addition, the anti-reflective coating formed from the anti-reflective coating forming composition can be used as a filling agent that can fill via holes without gap by applying it for the substrate on which via holes are formed and which is used in dual damascene process. Further, it can be used as a flattening agent for flattening the surface of semiconductor substrate having unevenness.

Hereinafter, the present invention will be described based on examples further concretely but the present invention is not limited thereto.

EXAMPLES

Synthetic Example 1

After 100 g of monoallyl diglycidyl isocyanuric acid (manufactured by Shikoku Chemicals Corporation), 66.4 g of 5,5-diethylbarbituric acid and 4.1 g of benzyltriethyl ammonium chloride were dissolved in 682 g of propylene glycol monomethyl ether, the mixture was reacted at 130° C. for 24 hours to obtain a solution containing a polymer. GPC analysis showed that weight average molecular weight of the obtained polymer was 6800 (in terms of standard polystyrene). In the meanwhile, it is assumed that the obtained polymer is a polymer having the structure of formula (14) as a repeating structural unit.

Synthetic Example 2

After 6.9 g of monoallyl diglycidyl isocyanuric acid, 5.8 g of 5-phenyl-5-ethylbarbituric acid and 0.3 g of benzyltriethyl ammonium chloride were dissolved in 52.1 g of propylene glycol monomethyl ether, the mixture was reacted at 130° C. for 24 hours to obtain a solution containing a polymer. GPC analysis showed that weight average molecular weight of the obtained polymer was 6900 (in terms of standard polystyrene). In the meanwhile, it is assumed that the obtained polymer is a polymer having the structure of formula (15) as a repeating structural unit.

Synthetic Example 3

After 50.0 g of terephthalic acid diglycidyl ester (manufactured by Nagase Chemtex Corporation, trade name: EX711), 30.4 g of monoallyl isocyanuric acid (manufactured by Shikoku Chemicals Corporation) and 2.0 g of benzyltriethyl ammonium chloride were dissolved in 330 g of propylene glycol monomethyl ether, the mixture was reacted at 130° C. for 24 hours to obtain a solution containing a polymer. GPC analysis showed that weight average molecular weight of the obtained polymer was 20000 (in terms of standard polystyrene). In the meanwhile, it is assumed that the obtained polymer is a polymer having the structure of formula (16) as a repeating structural unit.

Synthetic Example 4

After 50.0 g of terephthalic acid diglycidyl ester, 33.1 g of 5,5-diethylbarbituric acid and 2.0 g of benzyltriethyl ammonium chloride were dissolved in 340.4 g of propylene glycol monomethyl ether, the mixture was reacted at 130° C. for 24 hours to obtain a solution containing a polymer. GPC analysis showed that weight average molecular weight of the obtained polymer was 11100 (in terms of standard polystyrene). In the meanwhile, it is assumed that the obtained polymer is a polymer having the structure of formula (17) as a repeating structural unit.

Synthetic Example 5

After 7.0 g of terephthalic acid diglycidyl ester, 5.8 g of 5-phenyl-5-ethylbarbituric acid and 0.3 g of benzyltriethyl ammonium chloride were dissolved in 52.2 g of propylene glycol monomethyl ether, the mixture was reacted at 130° C. for 24 hours to obtain a solution containing a polymer. GPC analysis showed that weight average molecular weight of the obtained polymer was 12700 (in terms of standard polystyrene). In the meanwhile, it is assumed that the obtained polymer is a polymer having the structure of formula (18) as a repeating structural unit.

Synthetic Example 6

After 10.0 g of phthalic acid diglycidyl ester (manufactured by Nagase Chemtex Corporation, trade name: EX721), 6.4 g of monoallyl isocyanuric acid and 0.4 g of benzyltriethyl ammonium chloride were dissolved in 62.7 g of propylene glycol monomethyl ether, the mixture was reacted at 130° C. for 24 hours to obtain a solution containing a polymer. GPC analysis showed that weight average molecular weight of the obtained polymer was 4700 (in terms of standard polystyrene). In the meanwhile, it is assumed that the obtained polymer is a polymer having the structure of formula (19) as a repeating structural unit.

Synthetic Example 7

After 50.0 g of phthalic acid diglycidyl ester, 29.8 g of 5,5-diethylbarbituric acid and 1.8 g of benzyltriethyl ammonium chloride were dissolved in 326.3 g of propylene glycol monomethyl ether, the mixture was reacted at 130° C. for 24 hours to obtain a solution containing a polymer. GPC analysis showed that weight average molecular weight of the obtained polymer was 6600 (in terms of standard polystyrene). In the meanwhile, it is assumed that the obtained polymer is a polymer having the structure of formula (20) as a repeating structural unit.

Synthetic Example 8

After 7.7 g of phthalic acid diglycidyl ester, 5.8 g of 5-phenyl-5-ethylbarbituric acid and 0.3 g of benzyltriethyl ammonium chloride were dissolved in 55.3 g of propylene glycol monomethyl ether, the mixture was reacted at 130° C. for 24 hours to obtain a solution containing a polymer. GPC analysis showed that weight average molecular weight of the obtained polymer was 6600 (in terms of standard polystyrene). In the meanwhile, it is assumed that the obtained polymer is a polymer having the structure of formula (21) as a repeating structural unit.

Synthetic Example 9

After 10.0 g of isophthalic acid diglycidyl ester (manufactured by Nagase Chemtex Corporation, trade name: FCA016), 4.9 g of monoallyl isocyanuric acid and 0.33 g of benzyltriethyl ammonium chloride were dissolved in 76.2 g of propylene glycol monomethyl ether, the mixture was reacted at 130° C. for 24 hours to obtain a solution containing a polymer. GPC analysis showed that weight average molecular weight of the obtained polymer was 5700 (in terms of standard polystyrene). In the meanwhile, it is assumed that the obtained polymer is a polymer having the structure of formula (22) as a repeating structural unit.

Synthetic Example 10

After 10.0 g of isophthalic acid diglycidyl ester, 5.4 g of 5,5-diethylbarbituric acid and 0.3 g of benzyltriethyl ammonium chloride were dissolved in 61.0 g of propylene glycol monomethyl ether, the mixture was reacted at 130° C. for 24 hours to obtain a solution containing a polymer. GPC analysis showed that weight average molecular weight of the obtained polymer was 5300 (in terms of standard polystyrene). In the meanwhile, it is assumed that the obtained polymer is a polymer having the structure of formula (23) as a repeating structural unit.

Synthetic Example 11

After 8.6 g of isophthalic acid diglycidyl ester, 5.8 g of 5-phenyl-5-ethylbarbituric acid and 0.3 g of benzyltriethyl ammonium chloride were dissolved in 58.8 g of propylene glycol monomethyl ether, the mixture was reacted at 130° C. for 24 hours to obtain a solution containing a polymer. GPC analysis showed that weight average molecular weight of the obtained polymer was 4000 (in terms of standard polystyrene). In the meanwhile, it is assumed that the obtained polymer is a polymer having the structure of formula (24) as a repeating structural unit.

Synthetic Example 12

After 7.0 g of monoallyl diglycidyl isocyanuric acid, 7.1 g of 5,5-diethylbarbituric acid, 3.3 g of ethylene glycol diglycidyl ether and 0.4 g of benzyltriethyl ammonium chloride were dissolved in 71.4 g of propylene glycol monomethyl ether, the mixture was reacted at 130° C. for 24 hours to obtain a solution containing a polymer. GPC analysis showed that weight average molecular weight of the obtained polymer was 3900 (in terms of standard polystyrene). In the meanwhile, it is assumed that the obtained polymer is a polymer having the structure of formula (14) and the structure of formula (3) as repeating structural units.

Synthetic Example 13

After 3.0 g of terephthalic acid, 5.0 g of monoallyl diglycidyl isocyanuric acid and 0.2 g of benzyltriethyl ammonium chloride were dissolved in 32.8 g of propylene glycol monomethyl ether, the mixture was reacted at 130° C. for 24 hours to obtain a solution containing a polymer. GPC analysis showed that weight average molecular weight of the obtained polymer was 17800 (in terms of standard polystyrene). In the meanwhile, it is assumed that the obtained polymer is a polymer having the structure of formula (16) as a repeating structural units.

Synthetic Example 14

After 630.00 g of terephthalic acid diglycidyl ester, 427.35 g of 1,4-butanediol diglycidyl ether, 737.49 g of monoallyl isocyanuric acid and 49.60 g of benzyltriethyl ammonium chloride were dissolved in 7377.74 g of propylene glycol monomethyl ether, the mixture was reacted at 130° C. for 4 hours to obtain a solution containing a polymer. GPC analysis showed that weight average molecular weight of the obtained polymer was 9600 (in terms of standard polystyrene). In the meanwhile, it is assumed that the obtained polymer is a polymer having the structure of formula (16) and the structure of formula (39) as repeating structural units.

(39)

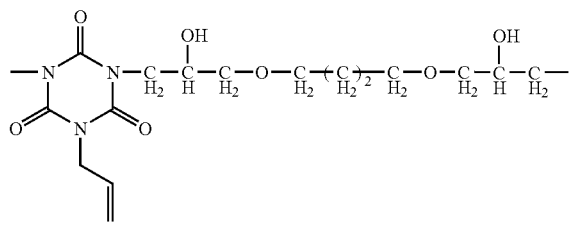

Synthetic Example 15

After 2.00 g of terephthalic acid diglycidyl ester, 5.43 g of 1,4-butanediol diglycidyl ether, 5.85 g of monoallyl isocyanuric acid and 0.39 g of benzyltriethyl ammonium chloride were dissolved in 54.69 g of propylene glycol monomethyl ether, the mixture was reacted at 130° C. for 4 hours to obtain a solution containing a polymer. GPC analysis showed that weight average molecular weight of the obtained polymer was 5600 (in terms of standard polystyrene). In the meanwhile, it is assumed that the obtained polymer is a polymer having the structure of formula (16) and the structure of formula (39) as repeating structural units.

Synthetic Example 16

After 3.00 g of terephthalic acid diglycidyl ester, 2.34 g of 1,6-hexanediol diglycidyl ether, 3.51 g of monoallyl isocyanuric acid and 0.24 g of benzyltriethyl ammonium chloride were dissolved in 36.36 g of propylene glycol monomethyl ether, the mixture was reacted at 130° C. for 4 hours to obtain a solution containing a polymer. GPC analysis showed that weight average molecular weight of the obtained polymer was 8800 (in terms of standard polystyrene). In the meanwhile, it is assumed that the obtained polymer is a polymer having the structure of formula (16) and the structure of formula (40) as repeating structural units.

(40)

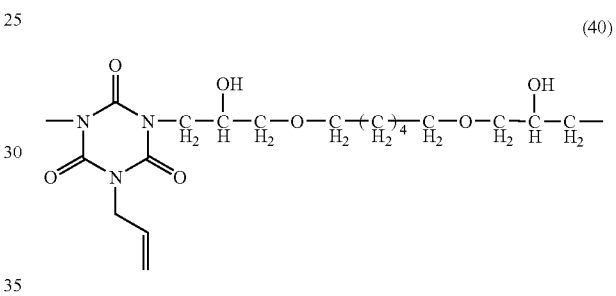

Synthetic Example 17

After 3.00 g of terephthalic acid diglycidyl ester, 5.47 g of 1,2-cyclohexane dicarboxylic acid glycidyl ester, 5.85 g of monoallyl isocyanuric acid and 0.39 g of benzyltriethyl ammonium chloride were dissolved in 58.84 g of propylene glycol monomethyl ether, the mixture was reacted at 130° C. for 4 hours to obtain a solution containing a polymer. GPC analysis showed that weight average molecular weight of the obtained polymer was 6600 (in terms of standard polystyrene). In the meanwhile, it is assumed that the obtained polymer is a polymer having the structure of formula (16) and the structure of formula (41) as repeating structural units.

(41)

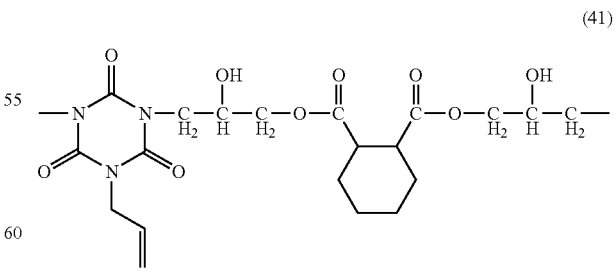

Synthetic Example 18

After 15.70 g of 1,2-cyclohexane dicarboxylic acid glycidyl ester, 15.00 g of terephthalic acid diglycidyl ester, 17.56 g of monoallyl isocyanuric acid and 1.18 g of benzyltriethyl ammonium chloride were dissolved in 197.78 g of propylene glycol monomethyl ether, the mixture was reacted at 130° C. for 24 hours to obtain a solution containing a polymer. GPC analysis showed that weight average molecular weight of the obtained polymer was 12800 (in terms of standard polystyrene). In the meanwhile, it is assumed that the obtained polymer is a polymer having the structure of formula (16) and the structure of formula (41) as repeating structural units.

Synthetic Example 19

After 24.92 g of 1,2-cyclohexane dicarboxylic acid glycidyl ester, 6.98 g of terephthalic acid diglycidyl ester, 18.03 g of monoallyl isocyanuric acid and 1.21 g of benzyltriethyl ammonium chloride were dissolved in 204.63 g of propylene glycol monomethyl ether, the mixture was reacted at 130° C. for 24 hours to obtain a solution containing a polymer. GPC analysis showed that weight average molecular weight of the obtained polymer was 9600 (in terms of standard polystyrene). In the meanwhile, it is assumed that the obtained polymer is a polymer having the structure of formula (16) and the structure of formula (41) as repeating structural units.

Synthetic Example 20

After 7.70 g of 1,2-cyclohexane dicarboxylic acid glycidyl ester, 25.01 g of terephthalic acid diglycidyl ester, 18.919 of monoallyl isocyanuric acid and 1.27 g of benzyltriethyl ammonium chloride were dissolved in 211.64 g of propylene glycol monomethyl ether, the mixture was reacted at 130° C. for 24 hours to obtain a solution containing a polymer. GPC analysis showed that weight average molecular weight of the obtained polymer was 18450 (in terms of standard polystyrene). In the meanwhile, it is assumed that the obtained polymer is a polymer having the structure of formula (16) and the structure of formula (41) as repeating structural units.

Synthetic Example 21

After 4.00 g of 1,2-cyclohexane dicarboxylic acid glycidyl ester, 2.34 g of teremonoallyl isocyanuric acid and 0.16 g of benzyltriethyl ammonium chloride were dissolved in 26.00 g of cyclohexanone, the mixture was reacted at 140° C. for 24 hours to obtain a solution containing a polymer. GPC analysis showed that weight average molecular weight of the obtained polymer was 7000 (in terms of standard polystyrene). In the meanwhile, it is assumed that the obtained polymer is a polymer having the structure of formula (41) as a repeating structural unit.

Synthetic Example 22

After 4.00 g of 1,2-cyclohexane dicarboxylic acid glycidyl ester, 2.55 g of 5,5-diethylbarbituric acid and 0.16 g of benzyltriethyl ammonium chloride were dissolved in 26.00 g of cyclohexanone, the mixture was reacted at 140° C. for 24 hours to obtain a solution containing a polymer. GPC analysis showed that weight average molecular weight of the obtained polymer was 5500 (in terms of standard polystyrene). In the meanwhile, it is assumed that the obtained polymer is a polymer having the structure of formula (42) as a repeating structural unit.

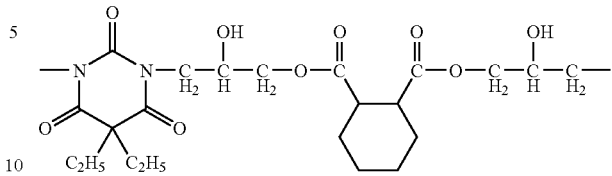

(42)

Synthetic Example 23

After 4.00 g of 1,2-cyclohexane dicarboxylic acid glycidyl ester, 3.22 g of 5-phenyl-5-ethylbarbituric acid and 0.16 g of benzyltriethyl ammonium chloride were dissolved in 29.51 g of cyclohexanone, the mixture was reacted at 140° C. for 24 hours to obtain a solution containing a polymer. GPC analysis showed that weight average molecular weight of the obtained polymer was 5200 (in terms of standard polystyrene). In the meanwhile, it is assumed that the obtained polymer is a polymer having the structure of formula (43) as a repeating structural unit.

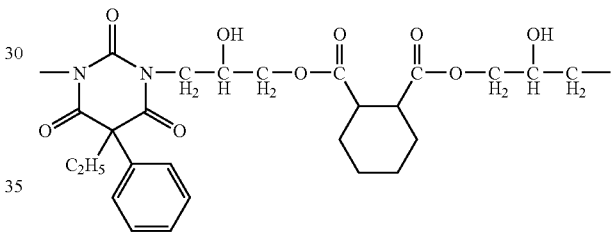

(43)

Synthetic Example 24

After 4.00 g of 1,2-cyclohexane dicarboxylic acid glycidyl ester, 1.58 g of parabanic acid, and 0.16 g of benzyltriethyl ammonium chloride were dissolved in 22.95 g of cyclohexanone, the mixture was reacted at 140° C. for 24 hours to obtain a solution containing a polymer. GPC analysis showed that weight average molecular weight of the obtained polymer was 4800 (in terms of standard polystyrene). In the meanwhile, it is assumed that the obtained polymer is a polymer having the structure of formula (44) as a repeating structural unit.

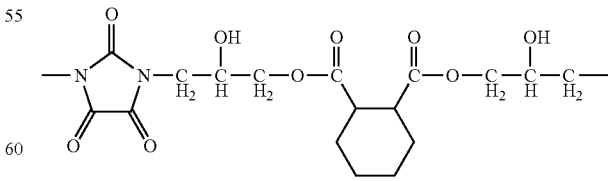

(44)

Example 1

In 10 g of the solution containing 2 g of polymer obtained in Synthetic Example 1, 0.5 g of tetramethoxymethylglycoluril (manufactured by Mitsui Cytec Co., Ltd., trade name: Powderlink 1174), 0.05 g of pyridinium-p-toluene sulfonate, 23 g of propylene glycol monomethyl ether, and 31 g of ethyl lactate were added, and then filtered through a micro filter made of polyethylene having a pore diameter of 0.10 μm to prepare an anti-reflective coating forming composition solution.

Examples 2 to 24

Similarly to Example 1, in 10 g of each solution containing 2 g of polymer obtained in Synthetic Examples 2 to 24, 0.5 g of tetramethoxymethylglycoluril (manufactured by Mitsui Cytec Co., Ltd., trade name: Powderlink 1174), 0.05 g of pyridinium-p-toluene sulfonate, 23 g of propylene glycol monomethyl ether, and 31 g of ethyl lactate were added to obtain a solution. Then, the solution was filtered through a micro filter made of polyethylene having a pore diameter of 0.10 μm and further a micro filter made of polyethylene having a pore diameter of 0.05 μm to prepare an anti-reflective coating forming composition solution.

Example 25

In 23.3 g of the solution containing 4.7 g of polymer obtained in Synthetic Example 1, 0.11 g of triphenylsulfonium hexafluoroantimonate, 1.2 g of tetramethoxymethylglycoluril, 0.06 g of pyridinium-p-toluene sulfonate, 9.6 g of propylene glycol monomethyl ether, and 65.8 g of ethyl lactate were added to a obtain a solution. Then, the solution was filtered through a micro filter made of polyethylene having a pore diameter of 0.10 μm and further a micro filter made of polyethylene having a pore diameter of 0.05 μm to prepare an anti-reflective coating forming composition solution.

Examples 26 to 33

The procedures similar to those of Example 25 were repeated except that the following compounds were used instead of triphenylsulfonium hexafluoroantimonate, respectively to prepare anti-reflective coating forming composition solutions: triphenylsulfonium trifluoromethane sulfonate (Example 26), triphenylsulfonium nonafluoro n-butane sulfonate (Example 27), N-(trifluoromethanesulfonyloxy)succinimide (Example 28), diphenyliodonium trifluoromethane sulfonate (Example 29), bis(phenylsulfonyl) diazomethane (Example 30), phenyl-bis(trichloromethyl)-s-triazine (Example 31), N-(trifluoromethanesulfonyloxy) naphthalimide (Example 32), and bis(4-tert-butylphenyl) iodonium trifluoromethane sulfonate (Example 33).

Dissolution Test in Photoresist Solvent

The anti-reflective coating forming composition solutions obtained in Examples 1 to 33 were coated on semiconductor substrates (silicon wafers) by means of a spinner, respectively. The coated silicon wafers were baked at 205° C. for 1 minute on a hot plate to form anti-reflective coatings (film thickness 0.10 μm). The anti-reflective coatings were dipped in ethyl lactate and propylene glycol monomethyl ether that are solvents used for photoresists, and as a result it was confirmed that the resulting anti-reflective coatings were insoluble in these solvents.

Test of Intermixing with Photoresist

On each anti-reflective coating (film thickness 0.23 μm) formed from the anti-reflective coating forming composition solutions obtained in Examples 1 to 33, a commercially available photoresist solution (trade name: PAR710 manufactured by Sumitomo Chemical Co., Ltd.) was coated by means of a spinner. The coated wafers were heated at 90° C. for 1 minute on a hot plate. After exposure of the photoresists to light, post exposure bake was performed at 90° C. for 1.5 minute. After developing the photoresists, the film thickness of the anti-reflective coatings was measured and no change in the film thickness was observed. Therefore, it was confirmed that no intermixing occurred between the anti-reflective coatings obtained from the anti-reflective coating forming composition solutions prepared in Examples 1 to 33 and the photoresist layers.

Test of Optical Parameter

The anti-reflective coating forming composition solutions prepared in Examples 1 to 33 were coated on silicon wafers by means of a spinner. The coated silicon wafers were baked at 205° C. for 1 minute on a hot plate to form anti-reflective coatings (film thickness 0.60 μm). On the anti-reflective coatings, refractive index (n) and attenuation coefficient (k) at a wavelength of 193 nm were measured with a spectroscopic ellipsometer (manufactured by J. A. Woolam Co., Inc., VUV-VASE VU-302). The measurement results are shown in Table 1.

Measurement of Dry Etching Rate

The anti-reflective coating forming composition solutions prepared in Examples 1 to 33 were coated on silicon wafers by means of a spinner, respectively. The coated silicon wafers were baked at 205° C. for 1 minute on a hot plate to form anti-reflective coatings. Then, dry etching rate (decreased amount of film thickness per unit time) on these anti-reflective coatings was measured with RIE system ES401 manufactured by Nippon Scientific Co., Ltd. under the condition in which $CF_4$ was used as dry etching gas.

Similarly, a photoresist solution (trade name: PAR710 manufactured by Sumitomo Chemical Co., Ltd.) was coated on a silicon wafer by means of a spinner. The coated silicon wafer was baked at 95° C. for 1 minute on a hot plate to form a photoresist layer. Then, dry etching rate was measured with RIE system ES401 manufactured by Nippon Scientific Co., Ltd. under the condition in which $CF_4$ was used as dry etching gas. The dry etching rate was compared between the anti-reflective coatings formed from the compositions of Examples 1 to 33 and photoresist PAR710. The results are shown in Table 1. In Table 1, selection ratio means the etching rate of each anti-reflective coating formed from each Example in case where the dry etching rate of the photoresist PAR710 is regarded as 1.00.

TABLE 1

| | n | k | Selection Ratio |
|---|---|---|---|
| Example 1 | 1.83 | 0.31 | 1.78 |
| Example 2 | 1.86 | 0.50 | 1.52 |
| Example 3 | 1.83 | 0.43 | 1.56 |
| Example 4 | 1.62 | 0.40 | 1.55 |
| Example 5 | 1.68 | 0.55 | 1.29 |
| Example 6 | 1.78 | 0.44 | 1.56 |
| Example 7 | 1.57 | 0.36 | 1.54 |
| Example 8 | 1.64 | 0.46 | 1.41 |
| Example 9 | 1.72 | 0.35 | 1.52 |
| Example 10 | 1.51 | 0.28 | 1.56 |
| Example 11 | 1.62 | 0.42 | 1.42 |
| Example 12 | 1.78 | 0.26 | 1.96 |
| Example 13 | 1.74 | 0.41 | 1.57 |
| Example 14 | 1.84 | 0.38 | 1.65 |
| Example 15 | 1.87 | 0.33 | 1.73 |
| Example 16 | 1.84 | 0.37 | 1.52 |
| Example 17 | 1.85 | 0.34 | 1.61 |

TABLE 1-continued

| | n | k | Selection Ratio |
|---|---|---|---|
| Example 18 | 1.83 | 0.33 | 1.57 |
| Example 19 | 1.85 | 0.25 | 1.54 |
| Example 20 | 1.81 | 0.40 | 1.59 |
| Example 21 | 1.86 | 0.20 | 1.52 |
| Example 22 | 1.65 | 0.14 | 1.50 |
| Example 23 | 1.71 | 0.34 | 1.32 |
| Example 24 | 1.64 | 0.07 | 1.55 |
| Example 25 | 1.82 | 0.32 | 1.78 |
| Example 26 | 1.82 | 0.32 | 1.78 |
| Example 27 | 1.82 | 0.32 | 1.78 |
| Example 28 | 1.82 | 0.32 | 1.78 |
| Example 29 | 1.82 | 0.32 | 1.78 |
| Example 30 | 1.82 | 0.32 | 1.78 |
| Example 31 | 1.82 | 0.32 | 1.78 |
| Example 32 | 1.82 | 0.32 | 1.78 |
| Example 33 | 1.82 | 0.32 | 1.78 |

From these results, it was found that the anti-reflective coatings prepared from the anti-reflective coating forming compositions of the present invention had a refractive index and attenuation coefficient fully effective for light of 193 nm. In addition, it was found that the anti-reflective coatings had a selection ratio of higher dry etching rate compared with photoresists. Therefore, time required for removing the anti-reflective coating by dry etching can be shortened, and undesirable phenomenon that film thickness of photoresist is reduced accompanied with removal of anti-reflective coatings by dry etching can be inhibited.

Evaluation of Photoresist Pattern Shape

The anti-reflective coating forming composition solutions prepared in Examples 4, 5 and 7 were coated on silicon wafers by means of a spinner, respectively. The coated silicon wafers were baked at 205° C. for 1 minute on a hot plate to form anti-reflective coatings (film thickness 0.031 μm from Example 4, film thickness 0.094 μm from Example 5, and film thickness 0.098 μm from Example 7). On the anti-reflective coatings, a commercially available photoresist solution (trade name: AR1221J manufactured by JSR Corporation) was coated by means of a spinner. The coated wafers were heated at 130° C. for 90 seconds on a hot plate to form photoresist coatings (film thickness 0.25 μm). Then, exposure to light was carried out with PAS5500/1100 scanner (wavelength 193 nm, NA, δ: 0.75, 0.89/0.55 (ANNULAR)) produced by ASML through a mask configured so that line-width of the photoresist after development and width between the lines could be 0.09 μm, that is, 0.09 μm/S (dense line), and 9 lines be formed. After exposure of the photoresists to light, post exposure bake was performed at 130° C. for 90 seconds. After cooling, the photoresist was developed with 0.26 N tetraethylammonium hydroxide aqueous solution as a developer according to 60-second single paddle process being industry standard.

The cross-section of the pattern of the obtained photoresist was observed with scanning electron microscope (SEM). As a result of it, it was observed that every resulting photoresist pattern shape was good and straight hem shape.

In addition, focus depth margin was determined as follows. The above-mentioned exposure to light was carried out by shifting the focus point by 0.1 μm up and down on the basis of the optimum focus point, and then resist pattern was formed by development process. A pattern in which 5 or more lines in 9 lines to be formed were formed was regarded as acceptance, and a pattern having remaining lines of 4 or less was regarded as rejection. And, a distance (width) of focus points between top and undermost on which the result of acceptance was obtained was regarded as focus depth margin. As a result of it, every focus depth margin was 0.5 or more. Further, photoresist patterns were formed by use of the anti-reflective coating forming compositions prepared in Examples 1 and 26 as mentioned above. The cross-section of the pattern of the obtained photoresist was observed with scanning electron microscope (SEM). The pattern from Example 1 was a little widened hem shape, and the pattern from Example 26 was good and straight hem shape.

The invention claimed is:

1. An anti-reflective coating forming composition comprising:

a polymer having a structure of formula (1):

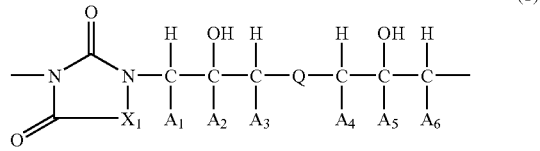

(1)

wherein $A_1, A_2, A_3, A_4, A_5$ and $A_6$ independently of one another are hydrogen atom, methyl or ethyl, $X_1$ is a group of formula (2), (3), (4) or (5):

(2)

(3)

(4)

(5)

wherein $R_1$ and $R_2$ independently of each other are hydrogen atom, $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, or $R_1$ and $R_2$ together may form $C_{3-6}$ring, $R_3$ is $C_{1-6}$alkyl, $C_{3-6}$alkenyl, benzyl or phenyl, and the phenyl may be substituted by a substituent selected from the group consisting of $C_{1-6}$alkyl, halogen atom, $C_{1-6}$alkoxy, nitro, cyano, hydroxy and $C_{1-6}$alkylthio, Q is a group of formula (6) or (7):

(6)

(7)

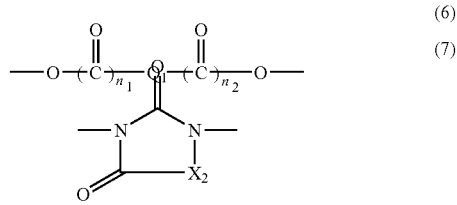

wherein $Q_1$ is $C_{1-10}$alkylene, phenylene, naphthylene or anthrylene, and the phenylene, naphthylene and anthrylene may be substituted by a substituent selected from the group consisting of $C_{1-6}$alkyl, halogen atom, $C_{1-6}$alkoxy, nitro, cyano, hydroxy and $C_{1-6}$alkylthio, $n_1$ and $n_2$ independently of each other are a number of 0 or 1, $X_2$ is a group of formula (2), (3) or (5), an acid compound or an acid generator, and a solvent, wherein the polymer having the structure of formula (1) is:
a polymer produced by a reaction of a compound of formula (8) with a compound of formula (9)

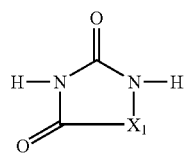
(8)

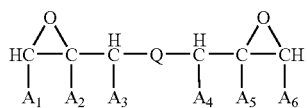
(9)

wherein $A_1, A_2, A_3, A_4, A_5, A_6, X_1$ and Q are as defined above, or a polymer produced by a reaction of a compound of formula (10) with a compound of formula (11)

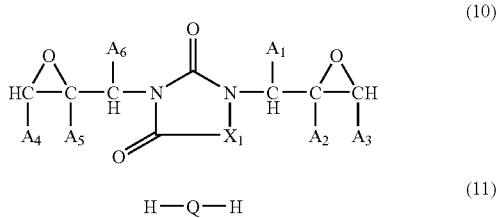
(10)

H—Q—H (11)

wherein $A_1, A_2, A_3, A_4, A_5, A_6, X_1$ and Q are as defined above.

2. The anti-reflective coating forming composition according to claim 1, wherein the structure of formula (1) is a structure of formula (12):

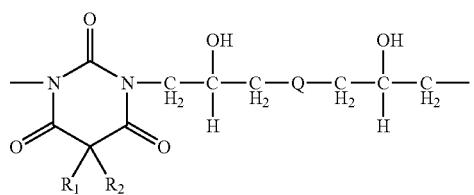
(12)

wherein $R_1$, $R_2$ and Q are as defined in claim 1.

3. The anti-reflective coating forming composition according to claim 1, wherein the structure of formula (1) is a structure of formula (13):

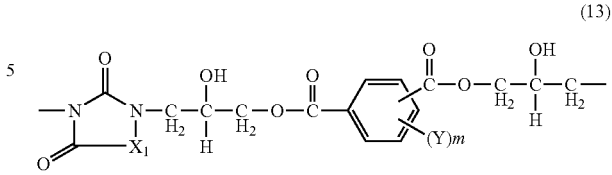
(13)

wherein $X_1$ is as defined in claim 1, Y is $C_{1-6}$alkyl, halogen atom, $C_{1-6}$alkoxy, nitro, cyano, hydroxy or $C_{1-6}$alkylthio, m is an integer of 0 to 4, and in case where m is 2 to 4, the Ys may be identical with or different from each other.

4. The anti-reflective coating forming composition according to claim 1, wherein the polymer having the structure of formula (1) is a polymer produced by a reaction of a compound of formula (8) with a compound of formula (9), and essentially having only the structure of formula (1) as a repeating structural unit.

5. The anti-reflective coating forming composition according to claim 1, wherein the polymer having the structure of formula (1) is a polymer produced by a reaction of a compound of formula (10) with a compound of formula (11), and essentially having only the structure of formula (1) as a repeating structural unit.

6. The anti-reflective coating forming composition according to claim 1, wherein the compound of formula (8) is an isocyanuric acid compound or a barbituric acid compound.

7. The anti-reflective coating forming composition according to claim 1, wherein the compound of formula (9) is a phthalic acid diglycidyl ester compound, a terephthalic acid diglycidyl ester compound or an isophthalic acid diglycidyl ester compound.

8. The anti-reflective coating forming composition according to claim 1, wherein the compound of formula (10) is a diglycidyl isocyanuric acid compound or a diglycidyl barbituric acid compound.

9. The anti-reflective coating forming composition according to claim 1, wherein the compound of formula (11) is a barbituric acid compound, a phthalic acid compound, a terephthalic acid compound or an isophthalic acid compound.

10. The anti-reflective coating forming composition according to claim 1, further comprising a crosslinking compound.

11. The anti-reflective coating forming composition according to claim 10, wherein the crosslinking compound is a nitrogen-containing compound having two to four nitrogen atoms substituted by methylol or alkoxymethyl.

12. The anti-reflective coating forming composition according to claim 1, wherein the acid compound is a sulfonic acid compound and the acid generator is an iodonium salt based acid generator or a sulfonium salt based acid generator.

13. The anti-reflective coating forming composition according to claim 1, further comprising an iodonium salt based acid generator or a sulfonium salt based acid generator and a sulfonic acid compound.

14. An anti-reflective coating obtained by coating the anti-reflective coating forming composition according to claim 1 on a semiconductor substrate, and baking it.

15. A method for forming photoresist pattern for use in manufacture of a semiconductor device, comprising:
coating the anti-reflective coating forming composition as described in claim 1 on a semiconductor substrate, and baking it to form an anti-reflective coating, forming a photoresist layer on the anti-reflective coating,
exposing the semiconductor substrate covered with the anti-reflective coating and the photoresist layer to light, and
developing the photoresist layer after the exposure to light.

16. The method for forming photoresist pattern according to claim 15, wherein the exposure to light is carried out with ArF excimer laser beam (wavelength 193 nm).

* * * * *

UNITED STATES PATENT AND TRADEMARK OFFICE
CERTIFICATE OF CORRECTION

PATENT NO. : 7,790,356 B2
APPLICATION NO. : 11/547001
DATED : September 7, 2010
INVENTOR(S) : Takahiro Kishioka et al.

It is certified that error appears in the above-identified patent and that said Letters Patent is hereby corrected as shown below:

In The Claims:
Column 34, lines 56-64, Claim 1 please replace formulae (6) and (7) with the following:

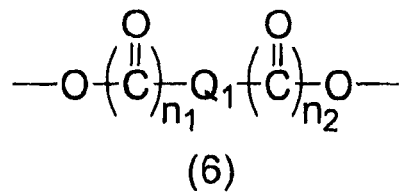

(6)

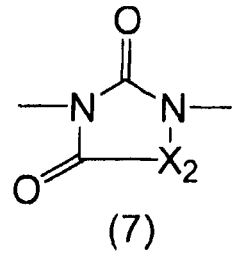

(7)

Signed and Sealed this

Fourteenth Day of December, 2010

David J. Kappos
*Director of the United States Patent and Trademark Office*